US010015610B2

(12) United States Patent
Park

(10) Patent No.: US 10,015,610 B2
(45) Date of Patent: Jul. 3, 2018

(54) METHOD AND DEVICE FOR ANALYZING AND PROCESSING ABNORMAL LOAD ON PREMISES BROADCASTING DEVICE

(71) Applicant: JUNJUNSA CO., LTD., Uijeongbu-si, Gyeonggi-do (KR)

(72) Inventor: Yong Soo Park, Uijeongbu-si (KR)

(73) Assignee: JUNJUNSA CO., LTD., Gyeonggi-do (KR)

( * ) Notice: Subject to any disclaimer, the term of this patent is extended or adjusted under 35 U.S.C. 154(b) by 0 days.

(21) Appl. No.: 14/909,596

(22) PCT Filed: Aug. 1, 2014

(86) PCT No.: PCT/KR2014/007114
§ 371 (c)(1),
(2) Date: Feb. 2, 2016

(87) PCT Pub. No.: WO2015/016660
PCT Pub. Date: Feb. 5, 2015

(65) Prior Publication Data

US 2016/0192101 A1 Jun. 30, 2016

(30) Foreign Application Priority Data

Aug. 2, 2013 (KR) ........................ 10-2013-0092007

(51) Int. Cl.
*H03G 11/00* (2006.01)
*H04R 29/00* (2006.01)
*H04R 3/00* (2006.01)

(52) U.S. Cl.
CPC ........... *H04R 29/007* (2013.01); *H04R 3/007* (2013.01); *H04R 2420/03* (2013.01); *H04R 2430/00* (2013.01)

(58) Field of Classification Search
CPC ........ H04R 29/001; H04R 3/007; H04R 3/00; H03F 2200/03
(Continued)

(56) References Cited

U.S. PATENT DOCUMENTS 4,468,806 A * 8/1984 Gaulden .................. H04R 3/12 381/123
2007/0057720 A1* 3/2007 Hand ...................... H03F 1/523 330/10
(Continued)

FOREIGN PATENT DOCUMENTS

JP 2001-155266 A 6/2001
JP 2002-345091 A 11/2002
(Continued)

*Primary Examiner* — Alexander Jamal
(74) *Attorney, Agent, or Firm* — Novick, Kim & Lee, PLLC; Jae Youn Kim

(57) ABSTRACT

A method and a device for analyzing and processing an abnormal load on a premises broadcasting device are provided. More particularly, a method for analyzing and processing an abnormal load on a loudspeaker including a distribution line connected to an output of an amplifier for the premises broadcasting device is provided. The method includes the steps of: comparing and analyzing a real-time individual load value with an individual load value at the early stage of abnormality analysis for an individual loudspeaker load; and electrically separating only the loudspeaker load, including the distribution line corresponding to a short, from the output of the amplifier for the premises broadcasting device in the comparison and analysis step.

3 Claims, 23 Drawing Sheets

(58) Field of Classification Search
USPC .................................... 381/55, 123, 59, 120
See application file for complete search history.

(56) References Cited

U.S. PATENT DOCUMENTS

| | | | | |
|---|---|---|---|---|
| 2011/0194705 | A1* | 8/2011 | Gautama | H03F 1/30 381/59 |
| 2011/0216920 | A1* | 9/2011 | Yamamoto | 381/120 |
| 2013/0070933 | A1* | 3/2013 | Itou | H04R 3/007 381/59 |

FOREIGN PATENT DOCUMENTS

| | | | |
|---|---|---|---|
| KR | 10-0661401 | B1 | 12/2006 |
| KR | 10-0944689 | B1 | 2/2010 |
| KR | 10-0998516 | B1 | 12/2010 |
| KR | 10-1037381 | B1 | 5/2011 |

* cited by examiner

METHOD AND DEVICE FOR ANALYZING AND PROCESSING ABNORMAL LOAD ON PREMISES BROADCASTING DEVICE

TECHNICAL FIELD

The present invention relates to a method and a device for analyzing and processing an abnormal load on a premises broadcasting device, and more particularly, to a method and a device for analyzing and processing an abnormal load on a premises broadcasting device that analyze abnormal loads of individual loudspeaker loads and immediately separate the corresponding abnormal lodes from a normal load group electrically to prevent broadcasting or sound transmission to houses that accommodate a normal load from being interfered in a loudspeaker load connected to a terminal at an output side of an amplifier of the premises broadcasting device, including distribution lines of a plurality of conditions in which a circuit is divided.

BACKGROUND ART

A facility characteristic of the premises broadcasting device used for public purposes and a short accident of a distribution line of a loudspeaker on a user environment cause a very serious problem.

Disconnection does not influence the same or a plurality of systems of normal loudspeaker loads, but in the case of short, a problem is, in a lump, caused in the normal loudspeaker load of the entirety of the same system due to a result such as broadcasting discontinuation and subsequently, the short may become a cause of damage of an output amplifier of a premises broadcasting device.

In particular, sound transmission stop primarily occurs and a side effect of the damage of the output amplifier secondarily occurs in a theatre, a rally place, an educational institution, and using multiple loudspeaker loads for public sound transmission.

Meanwhile, in the case of a multi-family house or a multi-layered apartment, since broadcasting stop of all houses due to the short in occurrence of an emergency situation or in the event of fire causes property loss and life damage, a short accident of the loudspeaker load including the distribution line of the loudspeaker is particularly specified and defined based on the Fire Safety Standards Act of emergency broadcast equipment in most countries at present.

In addition, conventional general background technology considering the short of the loudspeaker distribution line or the loudspeaker load of the premises broadcasting device may be largely divided into two types described below.

A first type background technology which is disclosed in Patent Registration No. 0661401 is a technology that protects the output amplifier by interrupting input and output signals of the output amplifier in the short and cannot avoid an entire broadcasting stop state and just protects the output amplifier.

A second type background technology disclosed in Patent Registration No. 0998516 is a technology that limits load short current approximately with a load current value corresponding to one system insertion resistance value in the short of the load under a condition to serially insert resistance of the same capacity as a load value for each corresponding load into each loudspeaker load system.

However, in the former case, as a countermeasure for protecting the amplifier or the speaker in the short, a function of a speaker or an amplifier of the loudspeaker stops by interrupting an input signal and an output signal as an amplifier protecting means, and as a result, a systematic condition that cannot prevent a broadcasting stop situation is provided in houses of the same system that accommodate normal loads, in which the short accident does not occur.

For example, as illustrated in FIG. 1, in the case of a short of a house loudspeaker group 3, since all loudspeaker distribution lines 4 and loads are connected in parallel through a speaker selection switch 2, whole broadcasting cannot but stop by an output interruption unit of an amplifier and speaker protection circuit 1 even though an input signal is present in a signal input terminal 5.

It can be seen that the Patent Registration No. 0661401 is used not for a house requiring in-system loudspeaker broadcasting but for protecting the amplifier and the speaker in an individual short through an electrical system of a signal and matters associated therewith is specified even in prior art of the registered patent.

In particular, the Patent Registration No. 0661401 mentions seriousness of the short accident of the loudspeaker distribution line due to the facility characteristic of the premises broadcasting device, but the final protection purpose is to protect the amplifier and the speaker and it can be seen that in the case where the corresponding device detects the short accident when the short accident occurs, an amplifier input signal is attenuated by a relay RY2 in a circuit diagram illustrated in FIG. 3 in a publication of the registered patent and an OUT signal of a relay RY1 is interrupted.

Therefore, an attenuation signal is input into the amplifier to operate weakly when the short is detected, but since a short or an abnormal output signal is interrupted by the relay RY1, the amplifier and the speaker are protected while broadcasting stops.

Accordingly, due to disconnection of an amplifier output signal of the corresponding broadcasting device, the broadcasting stops in the shorted house loudspeaker and normal house loudspeakers of the same system connected in parallel, and as a result, a public goal such as emergency broadcasting fire safety standards, and the like cannot be achieved.

Moreover, since the speaker and an output control unit are configured as a single circuit, it is apparent that a goal of the background art to be achieved is to protect apparatuses of the broadcasting device, and as a result, whole broadcasting such as sound transmission, announcement, or evacuation guidance broadcasting through the same system of loudspeaker distribution line cannot avoid the interruption situation when the short accident occurs in a house load such as a theatre, a rally place, an educational institution, or a multi-family house, or a multi-layered apartment using multiple loudspeaker loads for public sound transmission.

Meanwhile, the latter case discloses an amplifier protection device of a premises broadcasting circuit and according to the disclosed publication, there is a primary purpose that an output of the amplifier to other speaker is normally achieved by effective protecting the amplifier even though the short occurs in the speakers and states of the distribution lines of the speakers can be very easily monitored in real time to discover a problem in broadcasting circuit in the early stage.

That is, the amplifier protection device of the premises broadcasting circuit is provided in which resistance corresponding to an impedance value of the speaker which is a final load is added, however, inserted in series, and as a result, when the short occurs in the distribution line (load), the amplifier is not in a short state but the inserted resistance becomes an electrical load. Therefore, referring to FIG. 2, in regard to a circuit element additionally applied against the occurrence of the short, one R1, R2, or ~Rn is provided, N speaker selection switches 2 (switch 1, switch 2, and switch n) are universal mechanical contact passive switches, an LED level meter which is a component of the amplifier and speaker protection circuit 1 is used for visually determining the short, a final parallel connection is provided, in which all load distribution lines or the speaker selection switch 2 and the resistances R1, R2, and ~Rn are connected in series when the short occurs in one house (house 1) of the house loudspeaker group 3 or when an individual short occurs in the loudspeaker distribution lines 4, and as a result, the load resistances R1, R2, and ~Rn becomes corresponding loads regardless of an input signal of the input signal terminal 5 of the amplifier to protect the amplifier from overload short current and enable broadcasting transmission to residual houses (house 2 to house n) and herein, the following problems consequently occur.

First, the device disclosed in the Patent Registration No. 0998516 has a limit in that the device cannot autonomously read the short state or perform a confrontation action.

For example, when the short occurs in the speaker (including the distribution lines), as a load impedance value decreased to ½, and as a result, a load which is twice larger than the load in the normal state and since there is a structure in which a selection switch is fixed, the device cannot autonomously electrically open or separate the short distribution line, a person needs to decide whether to turn off the switch by a hand or separately configuring a relay using an additional device by reading whether it is abnormal through visually viewing a level meter.

However, in respect to the characteristic of the audio signal, a real-time change of the amplitude is large, a periodic change of the signal is also rapid and frequent, and the signal is irregularly changed, a short situation needs to be determined by visually distinguishing an LED level meter display difference which moves in response to the twice change of the load. Therefore, the possibility is not easy by unspecific majority having a common sense and further, there is a precondition that the person needs to monitor the level meter at normal times, and as a result, there is almost no effectiveness.

Second, Joule's heat($Q=0.24\ I^2Rt$) which is in proportion to the square of the load current and the corresponding resistance and time is generated due to insertion of resistance into speaker lines of all houses.

That is, in the case of a school cited by Patent Registration No. 0998516, individual classroom may have relatively small power (3 W to 10 W), but a plurality of classrooms (2-4) may be provided, and as a result, the classrooms may have 12 [W] to 40 [W] and a special room, a hallway, a playground may have hundreds of watts [W]. Therefore, there is a signal volume increase element and a fire risk element due to heat dissipation in consuming power similarly to the speaker, that is, heat dissipation processing.

Moreover, since the number of speaker loads is not one but multiple as many as all houses, a generated heat amount increases according to the sum-up of loads, a fire risk burden increases as much, and output power of the amplifier corresponding to heat dissipation of a dummy load causes additional loss and in the case of additional loss by the corresponding output power loss, power of approximately 1.2 times is wasted in a D-class amplifier and power corresponding to approximately twice of the output power is wasted in an AB-class amplifier.

Third, while a short protection operating function by the process is established, dummy load resistance having a capacity of 42[Ω] and 240 [W] is provided, which is the same as the speaker capacity and the output voltage of the amplifier needs to be twice larger than the standard (100 V) and an amplifier output capacity needs to also be twice (480 W) in order to normally use a universal 240 [W] speaker. That is, there is a condition in which the corresponding loss according to twice cannot be allowed.

Moreover, since voltage is twice while load impedance is half in the short, a capacity which the dummy load in an actual short needs to endure twice of the amplifier capacity that is, 960 [W] and before visually reading the LED level meter or turning off the switch due to a contact in a demand place, heat-resistant dummy load (resistance-1 to resistance-n) to endure the capacity needs to be naturally provided and the amplifier capacity requires general 4 times output power to endure the capacity, and as a result, there is a problem in that output setting is upward applied to 4 times in order to apply the amplifier to actual usage.

If it is premises that amplifier voltage and output do not increase, since total load impedance becomes twice due to synthetic impedance connected with the dummy load in series, there is a problem in that input power of the speaker cannot but decrease to ¼, and as a result, there is a negative effect in which remarkable volume decrease occurs together with significant loss. Therefore, it is inefficient and normal driving of the speaker device cannot be expected.

As a technology disclosed in amplifier and speaker protection circuits of two types of broadcasting devices or an amplifier protection device of the premises broadcasting circuit, there is a limit in that the effectiveness deteriorates even though a broadcasting stop situation cannot be prevented or is applied.

Further, unlike the case of the short in the loudspeaker distribution line and the load of the premises broadcasting device, since a serial additional equivalent state is distributed in an electrical attribute of the short due to the distribution line resistance value and the impedance value, the distribution line resistance value and the impedance value are aggregated to an actual load amount value.

For that reason, there is a limit in an attempt to settle an overload, an abnormal state, and the short by measuring impedance of the load or the magnitude of load current and that is to say, when a configurational detailed element of the load of the premises broadcasting device is described, an added impedance value actually includes a required equivalent resistance component of the loudspeaker distribution line as an effective value (several Ω to tens of Ω) in serial at all times and there is a problem in that a case in which the state of the short cannot be clearly determined due to a distribution line resistance value of a predetermined size.

As one example, in a load having an impedance value of 8[Ω], when a resistance value of the distribution line to which a capacity of 1000 [W] is applied is 10[Ω], since an impedance value of a practical load is 18[Ω], even though the short occurs in both ends of the load, the impedance value is recognized as the load of 10[Ω] and the load capacity which is less than 1000 [W], and as a result, a detection protecting device in the related art of the audio amplifier is not recognized as an overload state.

As another example, in a universal premises broadcasting device having line voltage of 100 [V], an impedance value of a 500 [W] load is 20[Ω] and in the case where the synthetic load impedance value when an equivalent resistance value of the distribution line is 20[Ω] or more becomes 40[Ω] or more and the short occurs in a load terminal, since the synthetic load impedance value becomes just 20[Ω] due to the distribution line resistance value, the impedance value cannot be recognized as the normal load of 20[Ω].

As such, since an actual distribution line resistance value of the loudspeaker distribution line of the premises broadcasting device becomes an aggregate element of an impedance increase added to correspond to an actual load, a determination reference point of the abnormal state and the overload of the distribution line or the load cannot but fluctuate, and as a result, the abnormal state cannot be clearly settled with a fixed absolute value.

Further, since the audio signal itself has a characteristic in that a voltage value of an effective output is progressed according to the time while continuously irregularly fluctuating, it is difficult to calculate an effective power value and even though an ideal average value is calculated, the abnormal state and the overload cannot be clearly concluded by concluding and defining the voltage value as the fixed value. For example, when 5 [W], 50 [W], 500 [W], or 5000 [W] is applied to the corresponding load, since the corresponding load may be the normal load, an addition function for abnormal load analysis cannot also a basic analyzing and processing function even though a converted specific load amount (value) becomes a predetermined reference value of the determination of the overload.

SUMMARY OF INVENTION

Technical Problem

The present invention is contrived to solve all problems by considering all problems in the related art described above and a primary purpose of the present invention is to prevent encumbrance in transmitting a broadcast or sound to houses that accommodate a normal load by electrically rapidly separating only an upward fluctuation load channel or a short load channel by individually comparing and analyzing a usage real-time load value or a fluctuation load value with respective normal load values individually stored and generated in the early stage of the abnormal load analyzing and processing by avoiding the related art of a single fixed limit value detecting scheme having all loudspeaker load groups as one overall load value.

Another purpose of the present invention is to maximize convenience in operating and managing a premises broadcasting device by providing a sign and alarm, a wired/wireless external transmittance control means of abnormal load analyzing and processing for all individual load channels requiring reading whether it is abnormal, such as a stand-by, short, disconnection, or normal state of each load.

Further, yet another purpose is to provide a structure of a device considering applicability and extensibility of an exterior structure and electrical connection optimized for real usage because the device needs to be installed at a usage place of the premises broadcasting device, such as an industrial site or a public place and perform the functions.

Solution to Problem

According to the present invention, as a means for achieving the purposes, a method for analyzing and processing an abnormal load on a loudspeaker including a distribution line connected to an output of an amplifier for the premises broadcasting device, includes the steps of: comparing and analyzing a real-time individual load value with an individual load value at the early stage of abnormality analysis for an individual loudspeaker load; and electrically separating only the loudspeaker load, including the distribution line corresponding to a short, from the output of the amplifier for the premises broadcasting device in the comparison and analysis step. (herein, the individual load value at the early stage is specified as an early 2 tied value, and the early 2 tied value is obtained by dividing an early load voltage by an early load current value; and the real-time individual load value is specified as a real-time 2 tied value, and the real-time 2 tied value is obtained by dividing a real-time load voltage value by a real-time load current value.)

According to another preferable feature of the present invention, the comparing and analyzing includes determining the short state or disconnection state by comparing the early 2 tied calculation value and the real-time 2 tied calculation value.

According to another preferable feature of the present invention, the short state includes that the individual load amount in usage real time is in an upward fluctuation abnormal load state as compared with the individual load amount in the early stage of the abnormal analysis and the disconnection state includes that the individual load amount in usage real time is in a downward fluctuation abnormal load state as compared with the individual load amount value in the early stage of the abnormal analysis.

According to another preferable feature of the present invention, the comparing and analyzing step includes determining the stand-by state or the normal state by comparing the early 2 tied calculation value and the real-time 2 tied calculation value.

According to another preferable feature of the present invention, the comparing and analyzing step includes determining, in the case where $A<B$ when the early 2 tied calculation value is A and the real-time 2 tied calculation value is B, the case as the short or the upward fluctuation abnormal load state and determining, in the case where $A>B$, the case as the disconnection or the downward fluctuation abnormal load state.

According to another preferable feature of the present invention, the comparing and analyzing step includes determining, in the case where $A=1$ and $B=0$ when the early 2 tied calculation value is A and the real-time 2 tied calculation value is B, the stand-by state and determining, in the case where $A=B$, the normal load state.

According to another preferable feature of the present invention, in the case of the short or upward fluctuation abnormal load state, connection between the loudspeaker loads including the output side of the amplifier of the premises broadcasting device and the distribution lines in the case of the disconnection abnormal state or the downward fluctuation abnormal load state, connection between the output side of the amplifier of the premises broadcasting device and the loudspeaker including the distribution lines is electrically maintained.

According to another preferable feature of the present invention, the short or upward fluctuation abnormal load state and the disconnection or downward fluctuation abnormal load state are displayed or alarmed to the outside.

According to another preferable feature of the present invention, the method includes transmitting determination information of the comparing and analyzing step to a remote place through a communication connection channel and receiving a control remote signal.

According to another preferable feature of the present invention, an early set-up step is further performed before the comparing and analyzing step, however, in an automatic step of the early set-up step, the load pattern 2 element values constituted by a load voltage value and a load current value in the early stage of the abnormal load analyzing and processing are stored and generated as the early 2 tied calculation value by receiving a signal from the output amplifier of the corresponding premises broadcasting device.

According to another preferable feature of the present invention, an early set-up step is further performed before the comparing and analyzing step, however, in a manual step of the early set-up step, the load pattern 2 element values constituted by the load voltage value and the load current value in the early stage of the abnormal load analyzing and processing are received through an external input means to be stored and generated as the early 2 tied calculation value.

According to another preferable feature of the present invention, the method includes providing the early 2 tied calculation value stored and generated in the early set-up step as a first condition element among the 2 condition inputs of the comparing and analyzing step and forming the real-time 2 tied calculation value by the load pattern 2 elements constituted by the real-time load voltage value and the real-time load current value and thereafter, providing the real-time 2 tied calculation value as a second condition input among the 2 condition inputs of the comparing and analyzing step.

A device for analyzing and processing an abnormal load on a premises broadcasting device includes: input connection units individually connected with respective output terminals of the amplifier of the premises broadcasting device; output connection units connected with individual loudspeaker loads and distribution lines; load current converting units connected to the input connection units in series; load voltage converting units connected to the input connection units in parallel; a load current amplifying and calculating unit receiving a current value of the load current converting unit and performing proportional target calculation and outputting of the received current value; a load voltage amplifying and calculating unit receiving a voltage value of the load voltage converting unit and performing of proportional target calculation and outputting of the received voltage value; an early set-up unit outputting a reference value corresponding to an individual load in the early stage of analyzing as a storage value output; a 2 tied calculation value generating unit storing and generating the storage value output received from the early set-up unit in the early stage of the analysis as an early 2 tied calculation value and forming the storage value output as a real-time 2 tied calculation value in analysis real time and the formed real-time 2 tied calculation value as a 2 condition input element as the corresponding data together the early 2 tied calculation value; a 4 logic analyzing and processing unit receiving and analyzing the early 2 tied calculation value and the real-time 2 tied calculation value as the 2 condition inputs and determining stand-by, short, disconnection, or normal states and give a control processing command as an abnormal analysis command signal; and a control unit opening or maintaining electrical connection of the output connection unit and the input connection unit according to a 4 logic analyzing and processing result.

According to another preferable feature of the present invention, the 4 logic analyzing and processing unit device includes a device is configured to determine the state by using the 2 condition inputs, however, the current state as a stand-by state when as the 2 condition input elements the early 2 tied calculation value=1 and the real-time 2 tied calculation value=0, as a short or upward fluctuation load state when the early 2 tied calculation value<the real-time 2 tied calculation value, as a disconnection or downward fluctuation load state when the early 2 tied calculation value>the real-time 2 tied calculation value, and as a normal state when the early 2 tied calculation value=the real-time 2 tied calculation value; and a device configured to transfer determination values of the 4 classification corresponding states to the control unit device as an abnormal analysis command signal.

According to another preferable feature of the present invention, the control unit includes a control device configured to receive the abnormal analysis command signal according to a 4 logic analyzing and processing result, however, electrically interrupt the connection between the input connection unit and the output connection unit in the case of the short or upward fluctuation load state in the abnormal analysis command signal; and a control device configured to electrically maintain the connection between the input connection unit and the output connection unit in the case of the disconnection or downward fluctuation load state.

According to another preferable feature of the present invention, the control unit is configured to include a display and alarm device that receive an analysis result output of the 4 logic analyzing and processing unit as an abnormal analysis command signal, however, may visually or auditorily distinguish and identify that the current state is the short, disconnection, stand-by, or normal state.

According to another preferable feature of the present invention, the device includes a transmittance control unit that receives the abnormal analysis command signal from the 4 logic analyzing and processing unit, however, transmits data corresponding to an analyzing and processing state to an external related apparatus through the corresponding communication means and receives a remote control signal.

According to another preferable feature of the present invention, each of the input connection unit and the output connection unit is constituted by 128 sets or less and 4 terminals or less per circuit, the load current converting unit is configured to obtain a conversion output value which is in proportion to load current that flows through the input connection unit, the number of the load current converting units is configured to be similar to the sum-up of individual output connection units, the load voltage converting unit is configured to obtain a conversion output value which is in proportion to input voltage applied to the input connection unit, the load current amplifying and calculating unit is configured to receive a signal of the load current converting unit as an input and correspond to the individual load current value for analyzing and processing as an output, and the load voltage amplifying and calculating unit is configured to receive a signal of the load voltage converting unit as the input and correspond to an individual load voltage value for analyzing and processing as an output.

According to another preferable feature of the present invention, an automatic set-up device of the early set-up unit includes a device configured to execute early set-up by receiving a signal of an output amplifier of the premises broadcasting device, however, configured in such a manner that the converted output signal of the amplifier of the premises broadcasting device passes through a load current side A-D converter and a load voltage side A-D converter and a device configured to transfer the storage value output to the 2 tied calculation value generating unit and store the storage output and thereafter, generate the early 2 tied calculation value.

According to another preferable feature of the present invention, a manual set-up device of the early set-up unit includes a device that does not receive a signal of an output amplifier of the premises broadcasting device as an early set-up signal and receive the corresponding data through a wired/wireless external input device and obtains the corresponding storage value output and transfers the storage value output to the 2 tied calculation value generating unit and a device configured to transfer the storage value output to the 2 tied calculation value generating unit and stores the storage value output and generate the early 2 tied calculation value.

According to another preferable feature of the present invention, the 2 tied calculation value generating unit includes a device configured to receive the storage value output of the early set-up unit as an early storage value input, a device configured to store the value in a non-volatile memory, a device configured to pass through a process device through an EEPROM storage value interface, a device configured to transfer an early 2 tied calculation value stored and generated through a drive interface as a first condition value among 2 condition inputs to the 4 logic analyzing and processing unit, and a device configured to receive a real-time calculation value input and transfer a real-time 2 tied calculation value generated through a real-time calculation value interface, an A-D converter, a process device, and a the driver interface to the 4 logic analyzing and processing unit as a second condition value among the 2 condition inputs.

According to another preferable feature of the present invention, the device for analyzing and processing an abnormal load on a premises broadcasting device includes a unit including an enclosure, the enclosure is a storage type layout structure; a device configured to include fixing holes which are detachable from/attachable to left and right sides of the enclosure and a control device, a display device capable of reading an abnormal analysis state for each channel or an autonomous alarm sound generating device on a front surface of the enclosure, and an attachable/detachable handle on both sides of the front surface of the enclosure.

The enclosure includes the device including: input connection units individually connected with respective output terminals of the amplifier of the premises broadcasting device; output connection units connected with individual loudspeaker loads and distribution lines; load current converting units connected to the input connection units in series; load voltage converting units connected to the input connection units in parallel; a load current amplifying and calculating unit receiving a current value of the load current converting unit and performing proportional target calculation and outputting of the received current value; a load voltage amplifying and calculating unit receiving a voltage value of the load voltage converting unit and performing of proportional target calculation and outputting of the received voltage value; an early set-up unit outputting a reference value corresponding to an individual load in the early stage of analyzing as a storage value output; a 2 tied calculation value generating unit storing and generating the storage value output received from the early set-up unit in the early stage of the analysis as an early 2 tied calculation value and forming the storage value output as a real-time 2 tied calculation value in analysis real time and the formed real-time 2 tied calculation value as a 2 condition input element as the corresponding data together the early 2 tied calculation value; a 4 logic analyzing and processing unit receiving and analyzing the early 2 tied calculation value and the real-time 2 tied calculation value as the 2 condition inputs and determining stand-by, short, disconnection, or normal states and give a control processing command as an abnormal analysis command signal; and a control unit opening or maintaining electrical connection of the output connection unit and the input connection unit according to a 4 logic analyzing and processing result.

According to another preferable feature of the present invention, the device for analyzing and processing an abnormal load on a premises broadcasting device includes a unit including an enclosure, the enclosure is a wall type layout structure; and a device configured to include a control device, a display device capable of reading an abnormal analysis state for each channel or an autonomous alarm sound generating device on a front surface of the enclosure.

The enclosure includes the device including: input connection units individually connected with respective output terminals of the amplifier of the premises broadcasting device; output connection units connected with individual loudspeaker loads and distribution lines; load current converting units connected to the input connection units in series; load voltage converting units connected to the input connection units in parallel; a load current amplifying and calculating unit receiving a current value of the load current converting unit and performing proportional target calculation and outputting of the received current value; a load voltage amplifying and calculating unit receiving a voltage value of the load voltage converting unit and performing of proportional target calculation and outputting of the received voltage value; an early set-up unit outputting a reference value corresponding to an individual load in the early stage of analyzing as a storage value output; a 2 tied calculation value generating unit storing and generating the storage value output received from the early set-up unit in the early stage of the analysis as an early 2 tied calculation value and forming the storage value output as a real-time 2 tied calculation value in analysis real time and the formed real-time 2 tied calculation value as a 2 condition input element as the corresponding data together the early 2 tied calculation value; a 4 logic analyzing and processing unit receiving and analyzing the early 2 tied calculation value and the real-time 2 tied calculation value as the 2 condition inputs and determining stand-by, short, disconnection, or normal states and give a control processing command as an abnormal analysis command signal; and a control unit opening or maintaining electrical connection of the output connection unit and the input connection unit according to a 4 logic analyzing and processing result.

Advantageous Effects of Invention

According to the present invention, in a plurality of premises broadcasting device loads including distribution lines, even though abnormality occurs in individual unspecific multiple loads, only an abnormal load can be electrically separated from a premises broadcasting device output amplifier or marked and measured, and as a result, public inconvenience can be resolved, a fire safety reference of an emergency broadcasting facility can be satisfied, and the device can be used for saving consumer goods of an output amplifier and preventing the amplifier from being damaged by preventing a harmful effect in which general broadcasting transferring and emergency evacuation broadcasting to all loudspeakers of houses that accommodate a normal load stop.

DESCRIPTION OF EMBODIMENTS

Figure 1:
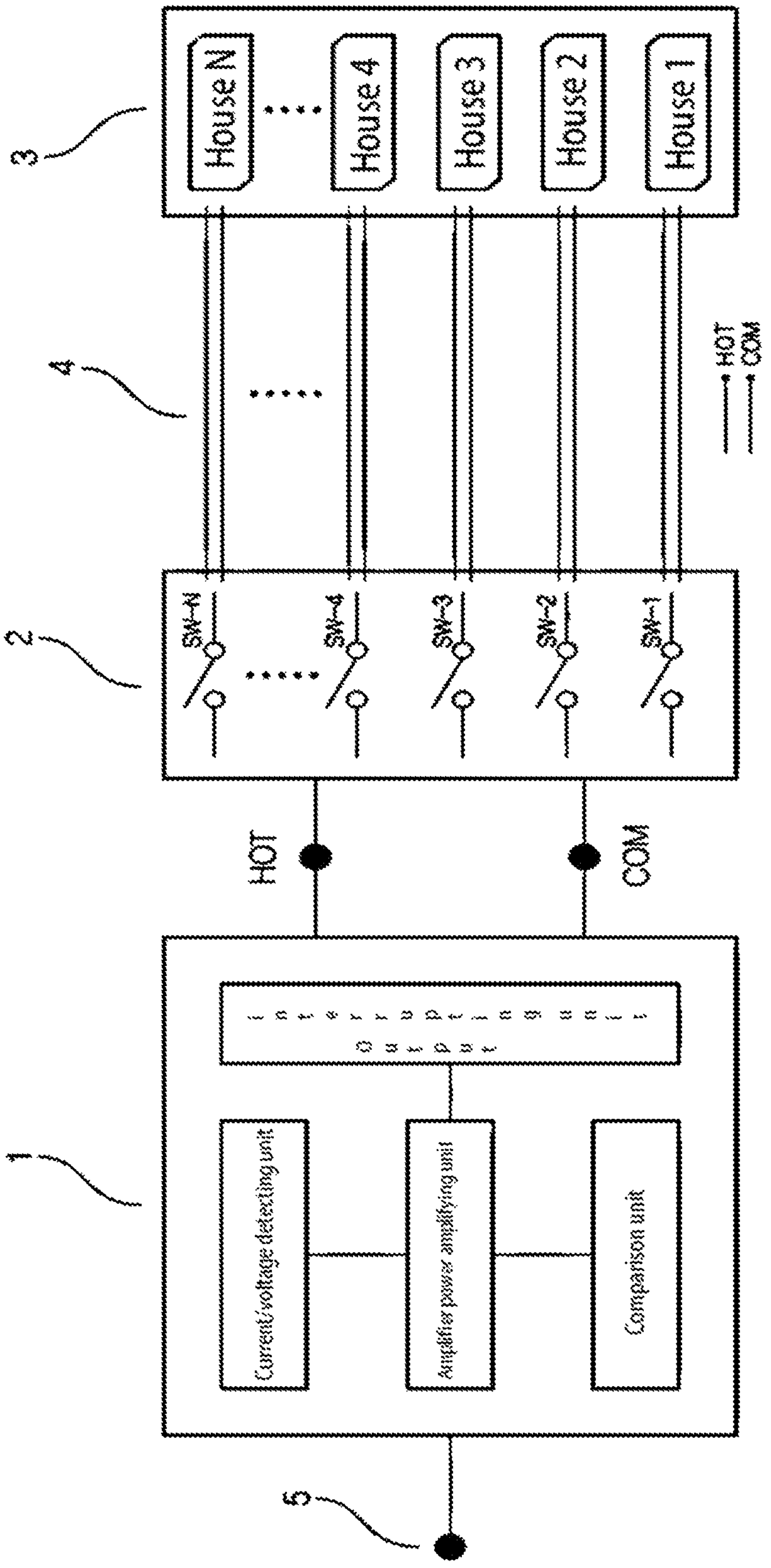
FIG. 1 is a background art reference system diagram for describing a whole broadcasting stop phenomenon when a short occurs in the related art.

Hereinafter, a preferred embodiment of the present invention will be described in detail with reference to the accompanying drawings.

Specific structural or functional descriptions of exemplary embodiments of the present invention disclosed in the specification are made only for the purposes of describing the exemplary embodiments of the present invention, and the exemplary embodiments of the present invention may be carried out in various forms, and it should not be construed that the present invention is limited to the exemplary embodiments described in the specification.

Further, an embodiment according to a concept of the present invention may have various modifications and various forms and specific exemplary embodiments will be illustrated in the drawings and described in detail in the detailed description. However, it is not intended to limit the embodiments according to the concept of the present invention to the specific embodiments, and it will be appreciated that the present invention includes all modifications, equivalences, or substitutions included in the spirit and the technical scope of the present invention.

In general, only when an abnormal is electrically separated from a house load group, it is possible to prevent broadcasting to a normal house load group from being stopped and further, it is possible to prevent a premises broadcasting output amplifier from being damaged.

Therefore, a core goal of abnormal load analysis processing of the present invention is first to take an action in which the device according to the present invention autonomously electrically separates the abnormal load from the normal load group without delay by analyzing the abnormal load and second to allow an operating process to be executed simultaneously with marking or transmitting and controlling a corresponding analysis action result.

Further, since the device according to the present invention needs to be inserted into an output side of an amplifier of a premises broadcasting device and individual house loads in terms of flow of an audio signal and the device according to the present invention needs to continuously perform abnormal analysis processing for each individual channel in real time, the device according to the present invention needs to be configured to perform functions of interested actions and results intended by an abnormal load analysis processing method.

Moreover, since the device needs to be installed at a usage place of the premises broadcasting device, such as an industrial site or a public place and perform the functions, an exterior structure optimized for real usage and a structure of the device considering applicability and extensibility of electrical connection are required.

Further, when a load of the premises broadcasting device may increase or decrease after initial construction of a load device at the house, when a determination reference value of the abnormal load is fixed to a predetermined integer value, a capability to cope with a load fluctuation situation is significantly limited, and as a result, whether a short, and the like occur may not actually be settled, as described in the prior art.

Therefore, the present invention discloses a method that forms an initial reference value by receiving a load pattern value corresponding to a real load through receiving a sound output from an output amplifier of the premises broadcasting device in the early stage of executing abnormality analysis in a real usage environment, not by a limit load value detection protecting scheme of the output amplifier of the premises broadcasting device or forms the initial reference value by receiving an eigen load value corresponding to a real load pattern value from an external input means and converts and memories and generates the initial reference value according to a purpose and thereafter, continuously compares the initial reference value with a real-time used load pattern for each individual channel to analyze and process the initial load pattern value which is memorized and thereafter generated in the early stage of the execution with the real-time load pattern value which fluctuates by a specific method, thereby rapidly electrically separating only the abnormal load channel from the output amplifier of the premises broadcasting device and associating 4 logic output results including stand-by, short, disconnection, and normality with corresponding processes to processes the abnormal load and a device associated with the same.

Figure 3:
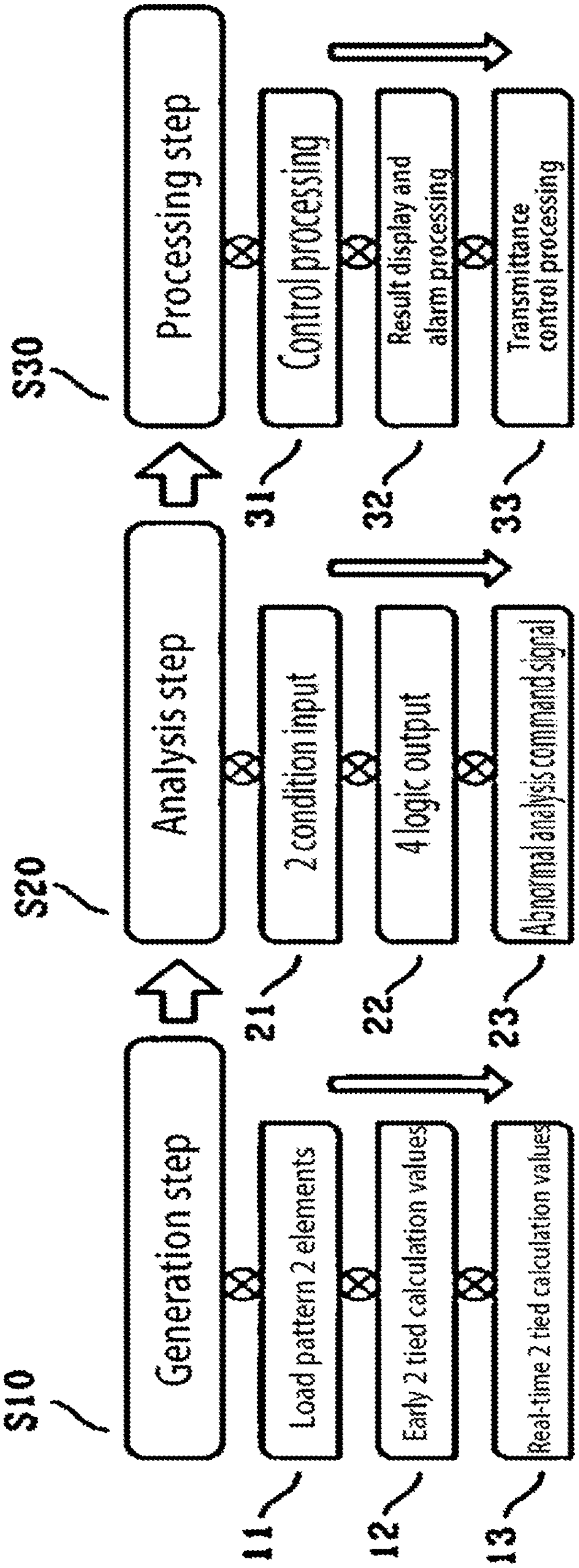
FIG. 3 is a configuration outline view illustrating a method for analyzing and processing an abnormal load according to the present invention.

First, in order to describe the method, referring to FIG. 3, the method for analyzing and processing the abnormal load includes a generation step (S10), an analysis step (S20), and a processing step (S30).

The generation step (S10) which is an execution process in the early stage of the abnormal load analyzing and processing includes processing processes of 2 load pattern elements 11, an early 2 tied calculation value 12, and a real-time 2 tied calculation value 13.

Further, the analysis step (S20) of the abnormal load analyzing and processing includes processing processes of 2 condition inputs 21, 4 logic outputs 22, and an abnormality analysis command signal 23.

Moreover, the processing step (S30) of the abnormal load analyzing and processing includes processes of control processing 31, result display and alarm processing 32, and transmittance control processing 33.

In this case, in the analyzing and processing process according to the present invention, the early 2 tied calculation value 12 and the real-time 2 tied calculation value 13 generated in the respective processing processes of the generation step (S10) are processed as the 2 condition inputs 21 of the analysis step (S20) to transfer a result of the 4 logic outputs 22 of the stand-by, the short, the disconnection, and the normality to the processing step (S30) as the abnormality analysis command signal 23.

In addition, in the processing step (S30), the output amplifier side of the premises broadcasting device and the load side are subjected to the electrical control processing 31, and the result is subjected to the result display and alarm processing 32 and subjected to the transmittance control processing 33 to the outside.

Herein, the early 2 tied calculation value 12 represents a ratio (%) obtained by dividing an early load voltage value generated by converting the early load voltage value into a reference value and performing a target calculation of the converted value and storing the calculated value in the early stage of execution of the abnormal load analyzing and processing by an early load current value and in this case, the early load voltage value and the early load current value become 2 load pattern elements 11 in the early stage of the abnormality analysis.

Moreover, the real-time 2 tied calculation value 13 represents a predetermined ratio (%) obtained by dividing a real-time load voltage value by a real-time load current value in usage real-time and in this case, the real-time load voltage value and the real-time load current value also constitute the 2 load pattern elements 11.

That is, the 2 load pattern elements 11 include both two values of the load voltage value and the load current value in the early stage of the execution and two values of the real-time load voltage value and the real-time load value during the usage.

In addition, concepts of residual terms will hereinafter be described through a detailed embodiment described below.

Moreover, prior to detailed description according to the present invention, a connection pattern of the loudspeaker and the amplifier of the house is first described.

When all premises broadcasting distribution lines are regarded as one load system, a systematic connection structure is final parallel connection. Therefore, in real life in which the output amplifiers are not used as many as the loads, even a short of a minority of unspecific loads of the same system or a short of only one load causes a short of the whole system.

As a result, the broadcasting is immediately stopped in the whole system and barely, when the output amplifier of the premises broadcasting device is damaged, houses that accommodate the loads are defenseless to the broadcasting stop until a cause of the short is removed or a cause of the damage of the amplifier is removed and a recovery work is performed due to a short accident which occurs sporadically.

However, according to the present invention, a harmful effect of the broadcasting stop may be prevented as described below.

Figure 4:
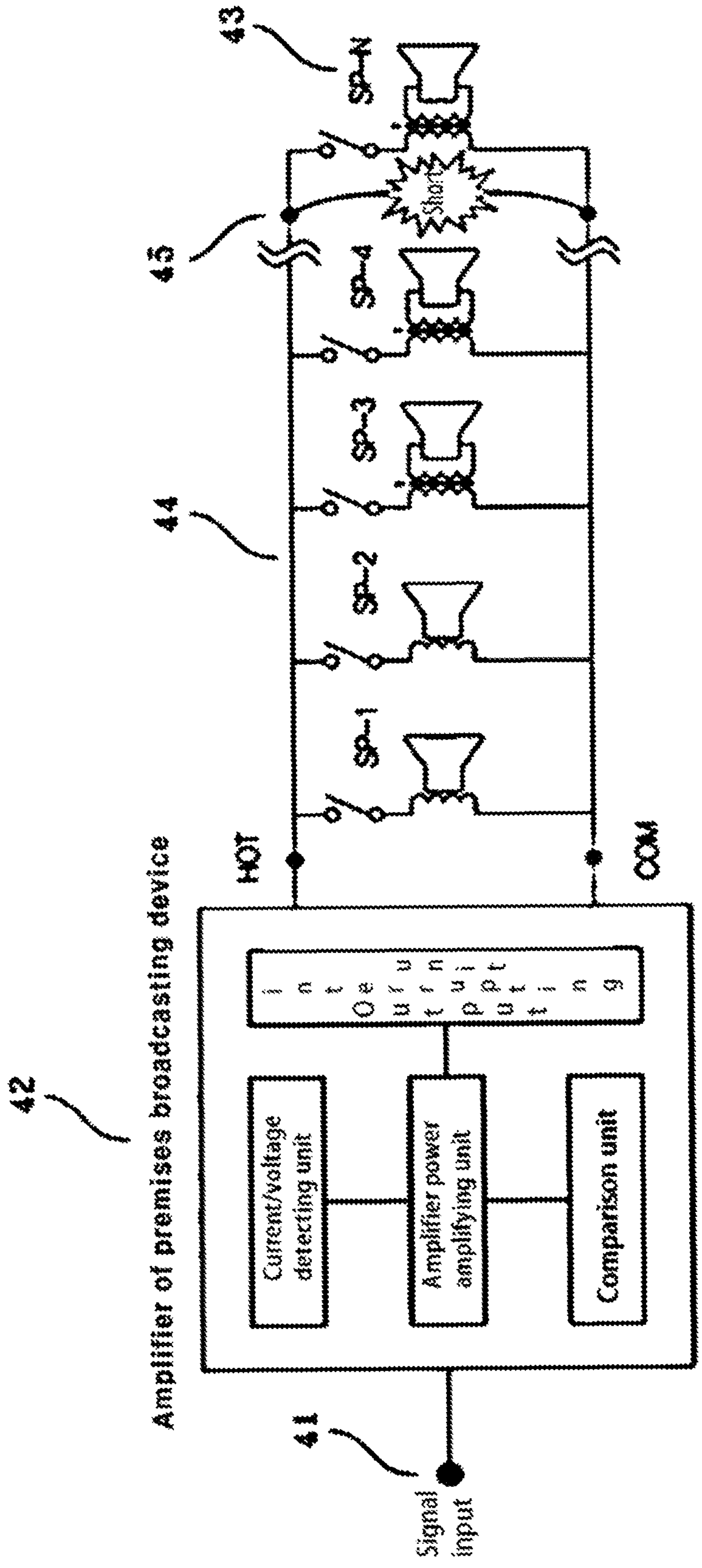
FIG. 4 is a diagram illustrating a parallel connection pattern of a house loudspeaker and an amplifier illustrating an influence which individual short accidents exert on a loudspeaker distribution line group according to the present invention.

In FIG. 4 illustrating an influence which the individual short accident exerts on a loudspeaker distribution line group, all house loudspeakers 44 are connected in parallel regardless of the number of the house loudspeakers 44 and connected even with a premises broadcasting device output amplifier 42.

Therefore, regardless of an initial stage and a final stage and regardless of a primary distribution line or a trunk distribution line or the front and the rear of a branch point of individual loads, since threshold of an unspecific short point 45 causes a whole short accident, the broadcasting is disabled in the entirety of an intermediate point house loudspeaker 44 including a final-stage house loudspeaker 43 regardless of existence of an input signal 41.

In particular, when the short occurs in terms of the premises broadcasting device amplifier 42, a sound signal or operating power is cut off in an embedded output interruption unit or the corresponding protection device due to an overload and the amplifier thus stops, and as a result, the broadcasting secondarily stops on the whole again.

In addition, even when the short occurs at speaker voice coils SP-1 and SP-2 of individual loudspeakers or at a secondary side of a matching transformer, the broadcasting is disabled and when the overload is applied to a primary coil of the matching transformer and heat is thus continuously dissipated, an additional short is subsequently caused due to inter-layer electrical breakdown of a primary winding coil and the broadcasting is disabled like damage of the speaker voice coils SP-1 and SP-2. Therefore, an influence of all short accidents of the individual house loads including the distribution lines exerted on a loudspeaker distribution line group brings out the whole broadcasting stop situation as described above at any point or any portion regardless of a type of a speaker load impedance value.

However, in the present invention, when the short partially occurs in the individual houses or all loudspeakers which are connected in parallel, a result of electrically separating only the corresponding loudspeaker load from the premises broadcasting device output amplifier, displaying the separated loudspeaker load, and performing alarm processing may be obtained, thereby preventing the whole broadcasting stop situation which is the problem described above.

In more detail, as illustrated in FIG. 3, in the generation step (S10), the early 2 tied calculation value 12 is calculated from the 2 load pattern elements 11 and stored in a storage table and thereafter, settled and generated as a comparison value to be provided as a first element of the process of the 2 condition inputs 21 in the analysis step (S20) which is a next process and further, the real-time 2 tied calculation value 13 in the usage real-time is generated from the 2 load pattern elements 11 to be provided as a second element of the process of the 2 condition inputs 21.

In this case, for the abnormal load analyzing and processing, a reference value in the early stage of the execution needs to be compared or analyzed and processed as compared with a situation value of an electrical real-time load and as described above, the 2 load pattern elements 11 is constituted by the load voltage value and the load current value and two load voltage values and two load current values are provided in each of the early execution and real-time usage and the early 2 tied calculation value 12 and the real-time 2 tied calculation value 13 are generated through conditional calculation of the load voltage value and the load current value.

Moreover, the early 2 tied calculation value 12 is generated by a scheme that target-converts the 2 load pattern elements 11 for achieving a ratio (%) of the load voltage value and the load current value which are 2 load pattern elements 11 in the early stage of the execution, target calculates the converted early execution load pattern 2 element values by averaging a plurality of early execution load pattern 2 element values in a unit time for accuracy of an analysis result, and stores the value in a corresponding memory table to determine the early 2 tied calculation value 12 which is a reference value of the abnormal which may be compared and analyzed with the real-time 2 tied calculation value 13.

Thereafter, the target-converted usage real-time load voltage value and load current value as the real-time load pattern 2 element values, the designated real-time load pattern 2 element values are target-calculated and generated as the real-time 2 tied calculation value 13 and thereafter, two conditions (early 2 tied calculation value and the real-time 2 tied calculation value) are provided as 2 condition inputs 21, respectively in the analysis step (S20) which is a next step of the abnormal load analyzing and processing to be subjected to 4 logic analyzing and processing.

In addition, the generation step (S10) which is a start step among the processing steps before the abnormal load analyzing and processing includes up to a step of providing an early reference value in the normal load to a non-volatile memory (see FIG. 16) of a 2 tied calculation value generating unit as an individual storage output value (see FIG. 15) so as to store and thereafter, generate the early 2 tied calculation value 12 from an early start for analysis as an early set-up step of the abnormal load analyzing and processing method according to the present invention.

Moreover, in order to generate the load voltage value and the load current value which is 2 load pattern elements 11 at the early start of the abnormal load analyzing and processing, two methods of manual generation and automatic generation are provided according to input scheme classification and two methods may be selectively applied or both methods may be applied.

For example, a manual input for the manual generation is a method that target-converts and applies the early 2 tied calculation value 12 for storage and generation by simply arbitrarily inputting a predetermined corresponding value by a universal input port or device from the outside as a means, such as generation by operating a PC, a mobile apparatus, or a body button or a program and when the early 2 tied calculation value 12 becomes a fixed value, since it is impossible to apply synchronization or optimization setting to a fluctuation real load, there is inconvenience that the early 2 tied calculation value 12 may not be flexibly applied to an increase or decrease in load or needs to be re-input afterwards, and as a result, it is preferable to provide an auxiliary means that may input the early 2 tied calculation value 12 and operating program data or upgrade an input value together by providing an external input through a wired/wireless communication network or an external input means such as a universal USB port, or the like.

In addition, an automatic input for automatic generation allows the process to be performed by receiving a real-time sound output from the premises broadcasting device output amplifier in a real usage environment.

Figure 16:
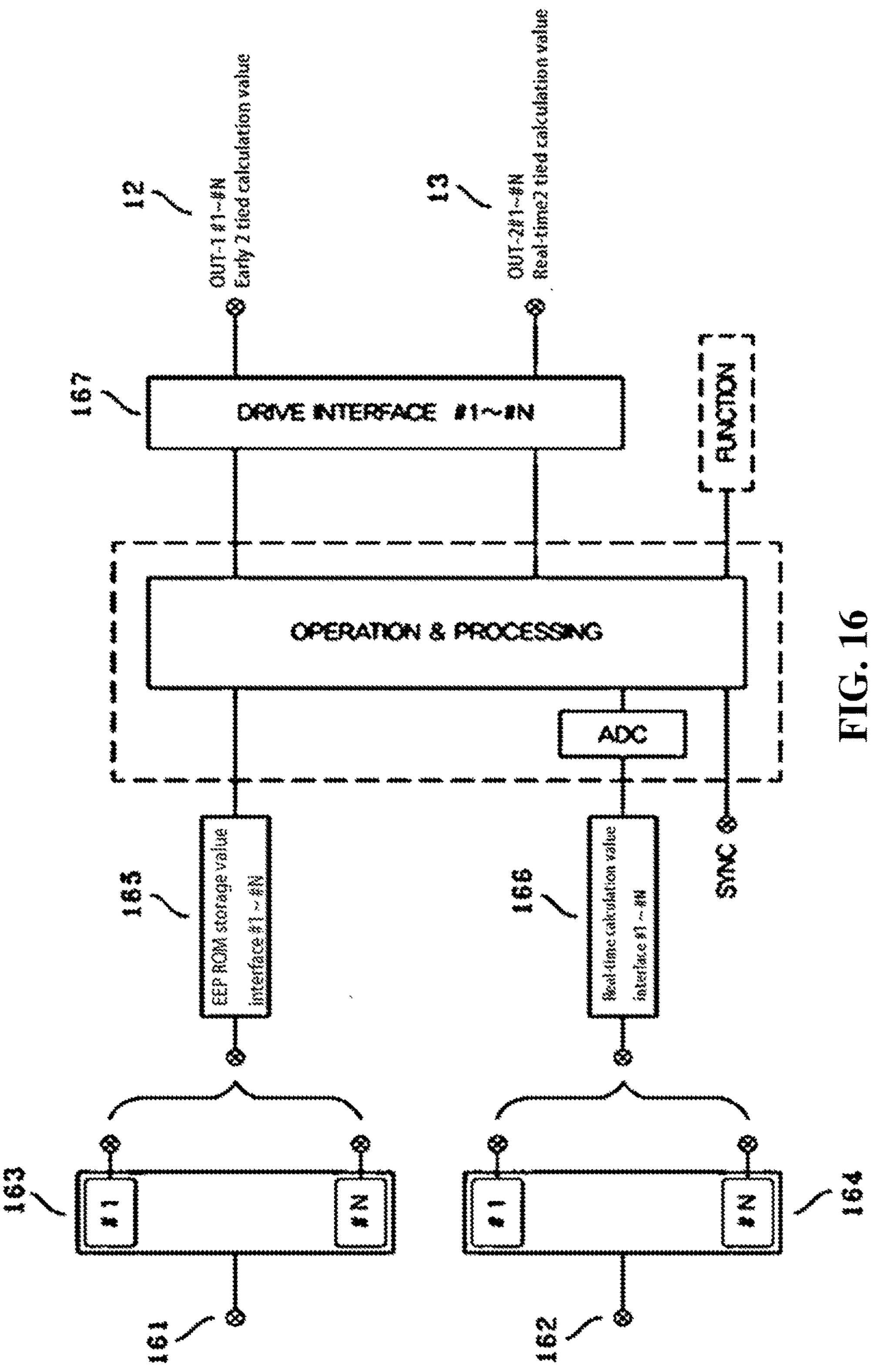
FIG. 16 is a configuration diagram of a 2 tied calculation value generating unit that stores a first condition element of 2 condition inputs for abnormal analysis in a corresponding non-volatile memory as the stored and output value received as the reference value in the early stage of execution and generates a usage real-time load value in real time as a second condition element of the 2 condition inputs and transfers the generated usage real-time load value to an analysis step.

Further, the load pattern 2 elements 11 are constituted by the load voltage value and the load current value in both the early stage of the abnormal load analysis and the usage real time and are applied as a means for storing and thereafter, generating the early 2 tied calculation value 12 illustrated in FIG. 16 through the early set-up process in the early stage of the execution of the abnormal load analyzing and processing and target-converted into the real-time 2 tied calculation value 13 illustrated in FIG. 16 in the usage real time of the abnormal load analyzing and processing to apply the early 2 tied calculation value and the real-time 2 tied calculation value which are first stored and thereafter, generated to be provided as two elements of the 2 condition inputs 21 to the analysis step (S20).

In this case, in the abnormal load analyzing and processing, external load associated elements among elements which exert a primary influence on the load pattern are the load voltage value and the load current value of corresponding symmetric alternating current substantially within 20 Hz to 100 kHz.

In addition, since power value [W]=voltage value×current value ($P=E \cdot I$), a normal load voltage value and a normal load current value are in proportion to each other in terms of a load amount in fixed and variable loads of general characteristics and a voltage value of an audio signal in a general state varies at several periods or dozens of periods or more even at 1 second and each of a voltage value and a current value varies almost for very period regardless of an average value and a peak value in an audio signal which varies and when load voltage increases, load current also increases and when the load voltage decreases, the load current also decreases.

Figure 5:
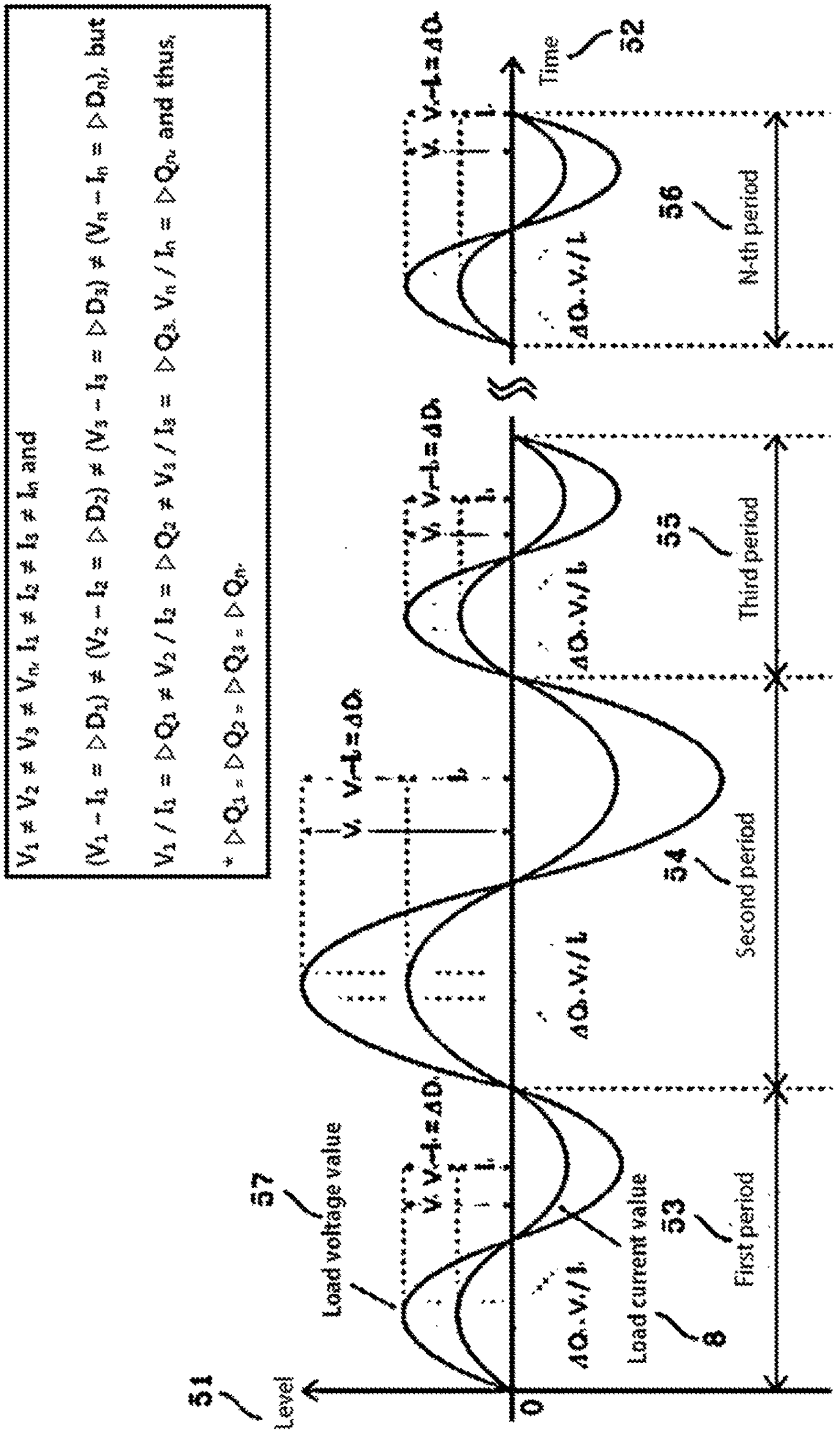
FIG. 5 is a diagram of a 2 tied calculation value illustrating that a voltage-to-current ratio of a load in an entire usage area of a loudspeaker load according to the present invention.

According to the present invention, as the 2 tied calculation values are illustrate din FIG. 5, a load voltage value 57 and a load current value 58 have the same phase and are in progress on the same time axis 52 and a continuous temporal flow while maintaining a predetermined mutual ratio.

Not an effective value of each of the load voltage value and the load current value but a comparison (%) width of the load voltage value and the load current value forms a predetermined tied calculation value, that is, the 2 tied calculation value in a predetermined load regardless of a specific load amount and an unspecific load amount in a load capacity size.

The load voltage value and the load current value which are in proportion to the power value (load amount) are constant to a progress direction (time) and a change pattern of the audio signal and forms an eigen characteristic voltage-current relationship.

As a result, since the values of the load pattern 2 elements 11 of FIG. 3 becomes the final early 2 tied calculation value 12 in the early set-up and the real-time 2 tied calculation value 13 in the usage real time, a level size and a period of the audio signal and the load amount vary limitlessly or widely, but the audio signal is in progress like first, second, third, . . . , N-th periods 53, 54, 55, . . . , 56 illustrated in FIG. 5, and as a result, when the load voltage value and the load current value are target-calculated for the abnormal load analyzing and processing, the 2 tied calculation value which is a ratio of the load voltage value and the load current value including the early stage of the execution and the usage real time may be obtained.

Therefore, the load voltage value and the load current value required to obtain the early 2 tied calculation value 12 and the real-time 2 tied calculation value 13 are specified as the load pattern 2 elements 11.

In particular, in the abnormal load analyzing and processing method, the early 2 tied calculation value 12 of the generation step (S10) is preferably configured by an average value of a conversion ratio (%) of the load pattern 2 elements 11, that is, the early load current value and the early load current value through the early set-up process which is the start process of the abnormal load analyzing and processing.

Moreover, as described above, the early 2 tied calculation value 12 means a predetermined rate having an eigen property, which may be obtained in a conditional relationship between the early load voltage value and the early load current value of the alternating current, which are two elements of the load pattern in the early stage of the abnormality analysis and the early load voltage value and the early load current value which are two elements of the load pattern in the early stage of the execution of each period are individually changed according to output signal fluctuation and the load amount of the premises broadcasting device output amplifier in a phenomenon of a flow process of the audio signal, but a calculation value according to the present invention, that is, a ratio (%) obtained by dividing the target-calculated early load voltage value by the early load current value does not vary and the ratio (%) is specified as the early 2 tied calculation value 12.

In more detail, as illustrated in FIG. 5, load voltage values 57 (V1, V2, V3, and Vn) for each period of the audio signal input from the premises broadcasting device output amplifier are provided and load current values 58 (I1, I2, I3, and In) for each period by an actual load amount of the premises broadcasting device output amplifier are provided and when the load voltage values and the load current values are diagrammatized with the same phase and the same time axis, if a difference between the load voltage value 57 and the load current value 58 corresponding to load values from the first period 53 to the N-th 56 is ~D1~n, a relationship of $(V1-I1=\Delta D1) \neq (V2-I2=\Delta D2) \neq (V3-I3=\Delta D3) \neq (Vn-In=\Delta Dn)$ is established and ΔD becomes the difference between the load voltage value 57 and the load current value 58.

However, ratios (%) obtained by dividing the load voltage value by the load current value from the first period to the N-th period are Q1 to n, a relationship of $V1/I1=\Delta Q1$, $V2/I2=\Delta Q2$, $V3/I3=\Delta Q3$, $Vn/In=\Delta Qn$ is established and ΔQ is $V1 \neq V2 \neq V3 \neq Vn$ and when a result of $\Delta Q1=\Delta Q2=\Delta Q3=\Delta Qn$ is constantly obtained even under a condition of $I1 \neq I2 \neq I3 \neq In$ and a condition of $(V1-I1=\Delta D1) \neq (V2-I2=\Delta D2) \neq (V3-I3=\Delta D3) \neq (Vn-In=\Delta Dn)$.

Herein, the obtained tied result value, Q1 to n is set as the 2 tied calculation value.

Therefore, as one example, a predetermined integer is substituted to calculate the 2 tied calculation value as described below.

In a load of 50[Ω], in the case of V1=100, V2=50, and V3=25, respective load currents I1, I2, and I3 are 100/50=2, 50/50=1, and 25/50=0.5 amperes, respectively.

In the present invention, since it is specifically premises that 2 tied calculation value=load voltage/load current, 2 tied calculation value#1=100/2=50, 2 tied calculation value#2=50/1=50, and 2 tied calculation value #3=25/0.5=50, and as a result, the result values (ratio) are the same.

That is, in the load of 50, even though supply voltages V1 to V3 for each period are changed to 100 [V], 50 [V], and 25 [V] and the load currents I1 to I3 are changed to 2 [A], 1 [A], and 0.5 [A], the 2 tied calculation value does not vary as 50.

Further, in a load of 500[Ω], in the case of V1=100, V2=20, and V3=10, respective load currents I1, I2, and I3 are 100/500=0.2, 20/500=0.04, and 10/500=0.02 amperes, respectively.

In the present invention, since it is specifically premises that 2 tied calculation value=load voltage/load current, 2 tied calculation value#1=100/0.2=500, 2 tied calculation value#2=20/0.04=500, and 2 tied calculation value #3=10/0.02=500, and as a result, the result values (ratio) are the same.

That is, in the load of 500, even though supply voltages V1 to V3 for each period are changed to 100 [V], 20 [V], and 10 [V] and the load currents I1 to I3 are changed to 0.2 [A], 0.04 [A], and 0.02 [A], the 2 tied calculation value does not vary as 500.

The 2 tied calculation value calculated as described above may be formed as an eigen value corresponding to only the load value regardless of a change in amplitudes of the load voltage value and the load current value.

In other words, even though input audio signal voltage is consecutively variably progressed at a limitless level of a graph level side 51 and a limitless time of a graph time axis 52 by passing through 0 (zero) which is a start point of the first period 53 in FIG. 5, a ratio (%) value of current to voltage in an entire area of the load may be continuously obtained to be the same while maintaining irrelevance with variation (period) values of the respective periods 53, 54, 55, and 56.

In the case of The early 2 tied calculation value obtained by such a scheme, when the short occurs at the load side or the load amount varies due to any reason, the early 2 tied calculation value and the rate value (%) vary due to the load pattern 2 elements in real time, an effective appropriate measure command component for abnormal load analysis may be obtained by comparing and analyzing the early 2 tied calculation values and the rate values.

Similarly, in FIG. 3, the real-time 2 tied calculation value 13 means a predetermined rate having an eigen property which may be obtained in a correlation between the real-time load voltage value (alternating current) and the real-time load current value (alternating current) which are two elements of the usage real-time load pattern and the real-time load voltage value and the real-time load current value which are two elements of the real-time load pattern are nominally changed at each period according to output signal fluctuation and the load amount of the output amplifier of the premises broadcasting device, but the calculation value, that is, the ratio between the real-time load voltage value and the real-time load current value which are target-calculated is not changed, and as a result, the ratio is specified as the real-time 2 tied calculation value.

Since the real-time 2 tied calculation value is constituted by the usage real-time load voltage value and the usage real-time load current value as described above in the same progress step in which the early set-up process of the abnormal load analyzing and processing, a method principle presented by the present invention is fundamentally the same as the early 2 tied calculation value in association with FIG. 5 in the real-time 2 tied calculation value.

Therefore, the real-time 2 tied calculation value is constituted by the real-time load voltage value and the real-time load current value which are the usage real-time load pattern 2 elements and the constituted real-time 2 tied calculation value becomes one of 2 condition input (21) elements of the abnormal load analyzing and processing step (S20) together with the early 2 tied calculation value which is finally stored and generated during the early set-up process.

In the case of the early 2 tied calculation value, an average storage value is generated at one time in the early stage of the execution, and as a result, a goal during the process is achieved, but in the case of the real-time 2 tied calculation value, a predetermined 2 tied calculation value is continuously monitored during the flow of the audio signal which continuously fluctuates in usage real time and is continuously compared with the early 2 tied calculation value, and as a result, when a predetermined fluctuation amount is calculated and analyzed, analysis command processing may be performed in a control device.

Meanwhile, in the analysis step (S20) is a step of transferring an abnormal analysis command signal to the corresponding elements in the processing step (S30) by receiving the early 2 tied calculation value 12 and the real-time 2 tied calculation value 13 generated in the generation step (S10) as 2 condition inputs 21 and classifying and outputting the 2 condition inputs 21 into the 4 logic outputs 22 (stand-by, short, disconnection, and normal states).

In the abnormal load analyzing and processing method, the process after the generation step (S10) provides the method that specifies 4 logic output analysis based on 2 inputs in the analysis step (s20) and the 2 condition inputs 21 are the early 2 tied calculation value 12 and the real-time 2 tied calculation value 13 generated by target-calculated with the load voltage value and the load current value in the early stage of the execution or in real time, which are the load pattern 2 elements 11 of the abnormal load analyzing and processing start process and the 4 logic outputs 22 are specified as 4 classification result outputs of the stand-by, the short, the disconnection, and the normal state which are analysis results by logic input of the 2 condition inputs 21.

Herein, the short is a comprehensive upward fluctuation load of the load including the distribution line as compared with the early 2 tied calculation value in a real load and the disconnection is a comprehensive downward fluctuation load of the load including the distribution line as compared with the early 2 tied calculation value in the real load.

Moreover, the abnormal analysis command signal 23 which is 4 logic output 22 is transferred to the processing step (S30) which is a third-step process of the abnormal load analyzing and processing method to perform control processing 31 of electrically interrupting or maintaining the output side and the load side of the amplifier of the premises broadcasting device and the same analysis result is commanded to a result display and alarm processing 32 as an execution signal and a result value is subjected to wired/wireless transmittance control processing 33 to external related organizations.

In addition, in the case of the 2 condition inputs 21, the early 2 tied calculation value 12 and the real-time 2 tied calculation value 13 generated in the generation step (S10) are received as the input elements.

Further, since the essence of the early 2 tied calculation value 12 is the early load current value as compared with the early load voltage value, the early 2 tied calculation value 12 is generated and thereafter, stored as different result values for each load according to a change in the early load voltage value and the early load current value which are the load pattern 2 elements in the early stage and transferred to the process of the 2 condition inputs 21 of the analysis step (S20) as a first condition value among the 2 condition inputs.

Moreover, since the real-time 2 tied calculation value 13 is an individual value of the real load corresponding to a real load pattern according to the change in real-time load voltage value and the real-time load current value which are real-time load pattern 2 elements as the real-time load current value as compared with the real-time load voltage value, the real-time 2 tied calculation value 13 is transferred to a process of the 2 condition inputs 21 of the analysis step (S20) as a second condition value among the 2 condition inputs 21 together with the early 2 tied calculation value 12 stored and formed in the early stage of the execution to generate (output) the 4 logic output 22 results and transfer the generated 4 logic output 22 results to the corresponding process after the abnormal load analyzing and processing and a correlation comparison condition equation of the early 2 tied calculation value 12 and the real-time 2 tied calculation value 13 corresponding to the 2 condition inputs 21 is shown as four types as shown in Table 1 given below.

TABLE 1

| Types | 4 type conditions of 2 tied calculation value |
|---|---|
| 1 | Early 2 tied calculation value = 1, real-time 2 tied calculation value = 0 |
| 2 | Early 2 tied calculation value < real-time 2 tied calculation value |
| 3 | Early 2 tied calculation value > real-time 2 tied calculation value |
| 4 | Early 2 tied calculation value = real-time 2 tied calculation value |

As shown in Table 1, a 2 condition equation of the early 2 tied calculation value 12 and the real-time 2 tied calculation value 13 is classified into 4 types.

A first type is the early 2 tied calculation value=1 and the real-time 2 tied calculation value=0 and since the early 2 tied calculation value stored and generated in a 2 tied calculation value generating unit exists in the early set-up but the real-time 2 tied value does not exist, one value of the load current value and the load voltage value exists and the first type is a step in which there is no signal, and as a result, the corresponding state may be analyzed and processed through a predetermined calculation process and the 4 logic outputs 22.

A second type is the early 2 tied calculation value<the real-time 2 tied calculation value and since the real-time 2 tied value is larger than the early 2 tied calculation value stored and generated in the 2 tied calculation value generating unit in the early set-up in real usage, the load amount increases as compared with the early stage of the execution, and as a result, the corresponding state may be analyzed and processed through a predetermined calculation process and the 4 logic outputs 22.

A third type is the early 2 tied calculation value>the real-time 2 tied calculation value and since the real-time 2 tied calculation value is smaller than the early 2 tied calculation value stored and generated in the 2 tied calculation value generating unit in the early set-up in real usage, the load amount decreases as compared with the early stage of the execution, and as a result, the corresponding state may be analyzed and processed through the predetermined calculation process and the 4 logic outputs 22.

A fourth type is the early 2 tied calculation value=the real-time 2 tied calculation value and since the early 2 tied calculation value and the real-time 2 tied value stored and generated in the 2 tied calculation value generating unit in the early set-up are the same as each other, and as a result, the load does not fluctuate. Therefore, the corresponding state may be analyzed and processed through the predetermined calculation process and the 4 logic outputs 22.

In addition, in FIG. 3, a correlation of the early 2 tied calculation value and the real-time 2 tied calculation value which are the 2 condition input elements is subjected to predetermined calculation or logical output by the 4 logic outputs 22 in the process of the 2 condition inputs 21 of the analysis step (S20) to be analyzed and classified into 4 command values and a result value formed for an output is transferred to the processing step (S30) as the abnormal analysis command signal 23.

In this case, the result value of the 4 logic outputs 22 by the 2 condition inputs 21 is classified into 4 states of the stand-by, short, disconnection, and normal states and the result value is shown in Table 2.

TABLE 2

| Types | Relationship of 2 conditions | Analysis and classification result | Real-time comparison of load pattern 2 elements |
|---|---|---|---|
| 1 | Early 2 tied calculation value = 1, real-time 2 tied calculation value = 0 | Stand-by | Load voltage = 0: Load current = 0 |
| 2 | Early 2 tied calculation value < real-time 2 tied calculation value | Short | Load voltage = 0: Load current = 1 |
| 3 | Early 2 tied calculation value > real-time 2 tied calculation value | Disconnection | Load voltage = 1: Load current = 0 |
| 4 | Early 2 tied calculation value = real-time 2 tied calculation value | Normal state | Load voltage = 1: Load current = 1 |

As shown in Table 2, 4 analysis results of the standby, short, disconnection, and normal states are transferred to the processing step (S30) as the abnormal analysis command signal 23 by the 2 condition equation relationship of 4 types.

A first type is the early 2 tied calculation value=1 and the real-time 2 tied calculation value=0 and since the early 2 tied calculation value stored and generated in a 2 tied calculation value generating unit exists in the early set-up but the real-time 2 tied value does not exist, one value of the load current value and the load voltage value exists and the first type is a step in which there is no signal, and as a result, the corresponding state may be analyzed and processed as the stand-by state.

A second type is the early 2 tied calculation value<the real-time 2 tied calculation value and since the real-time 2 tied value is larger than the early 2 tied calculation value stored and generated in the early set-up in the real usage, the load amount increases as compared with the early stage of the abnormal load analyzing and processing, and as a result, the second type is analyzed and classified as the short or upward fluctuation load state.

A third type is the early 2 tied calculation value>the real-time 2 tied calculation value and since the real-time 2 tied value is smaller than the early 2 tied calculation value stored and generated in the real usage, the load amount decreases as compared with the early stage of the abnormal load analyzing and processing, and as a result, the third type is analyzed and classified as the short or downward fluctuation load state.

A fourth type is the early 2 tied calculation value=the real-time 2 tied calculation value and since the early 2 tied calculation value and the real-time 2 tied value stored and generated are the same as each other, the load does not fluctuate in real time as compared with the early stage of the abnormal load analyzing and processing, and as a result, the fourth type is analyzed and classified into the normal state.

An analysis and classification result obtained during processing the four types is settled as the abnormal analysis command signal 23 and a command value is transferred to the processing step (S30).

Further, when the real-time comparison of the load pattern 2 elements is applied as a condition as necessary in Table 2, 4 logic output values may be just obtained as a result and for example, the stand-by state is a state in which since a load voltage condition is 0 while input signal voltage is 0, a load current condition is also 0 due to no current, the short state means a state in which the load voltage condition is 0 while a load current condition 1 and a state in which load current of 1 is abnormal load current which exceeds normal current and load voltage of 0 becomes short voltage in which residual drop voltage goes toward approximately 0 according to a degree of the short, the disconnection state is a state in which since there is no load while the load voltage condition is 1, the load current condition is 0, and the normal state means a state in which real used voltage is analyzed to be formed while the load voltage condition is 1 and real used current is formed while the load current condition is also 1.

As described above, the 4 logic output analysis and classification result satisfies 4 elements required for abnormal analyzing and processing of the load of the premises broadcasting device.

4 results of the standby, short, disconnection, and normal states which are the analysis and classification result by the 4 logic outputs 22 become 4 abnormal analysis command signal 23 in the abnormal load analyzing and processing method of the present invention.

In addition, the settled abnormal analysis command signal 23 (see FIG. 3) is transferred to the processing step (S30) to transfer a processing control command to the control processing 31, the result display and alarm processing 32, and the transmittance control processing 33.

As such, a purpose of the processing step (S30) is to perform of the control processing 31 of a relay added between the output side of the amplifier of the premises broadcasting device and the load of the loudspeaker of the house based on the 4 logic output values of the abnormal analysis command signal 23, to perform the result display and alarm processing 32 to allow a management operator to intuitively identify the abnormal load state by commonly using visual and auditory means based on the 4 logic output values of the above abnormal analysis command signal 23, and to perform transmittance control processing 33 of the state and a processing or progress situation of the abnormal load based on the 4 logic output values of the above abnormal analysis command signal 23 to the external related organization through wired/wireless communication means as data.

In this case, the control processing 31 constituting the processing step (S30) is a process for controlling a contact through a multi-contact relay or an electronic non-contact relay (solid state relay (SSR)) added between the output side of the amplifier of the premises broadcasting device and the load of the loudspeaker of the house by receiving the 4 logic output values of the abnormal analysis command signal 23 which is the analysis step (S20).

NO and NC contacts of the relay may house a common terminal, an emergency terminal, a normal terminal, and the like and operate with a contact capacity of 100 [A], flux-magnetizing voltage, current of 50 [V] and 1 [A] or less, a delay time of 0.5 sec. or less, and supplied power voltage 100 [V] or less.

When the NC contact is applied in the case where the abnormal load analysis result value is in the normal state, the corresponding relay may be actuated only in the short to thereby reduce all-time actuation power consumption.

In the case of the control processing 31, a function of a speaker (load) selector may also be performed as the control processing (device).

Further, the result display and alarm processing 32 constituting the processing step (S30) is used to allow the management operator to intuitively identify the state of the abnormal load by using the visual and auditory means in parallel by receiving the 4 logic output values of the abnormal analysis command signal 23 which is the analysis step (S20).

To this end, display lamps and string arrays of the display of the stand-by, short, disconnection, and normal states may be distinguished with colors and separately read for each channel.

An alarm sound has a structure in which vibration sound of a generation unit is directly transferred and a sign means that allows the alarm sound to be temporarily cancelled as necessary and announces that the alarm sound is cancelled is added.

The result display requires an independent display step for each channel, but one alarm sound generating device is commonly used.

Moreover, the transmittance control processing 33 is used to transmit the state and a processing or progress situation of the abnormal load based on the 4 logic output values to the external related organization through the wired/wireless communication means as the data.

In this case, only when the transmittance control processing 33 is bidirectionally configured, the abnormal load analyzing and processing process may be operated and monitored externally remotely and a real load situation and a process progress state are transmitted together with the analysis result for each channel and remotely operated and configured at a third place.

Figure 6:
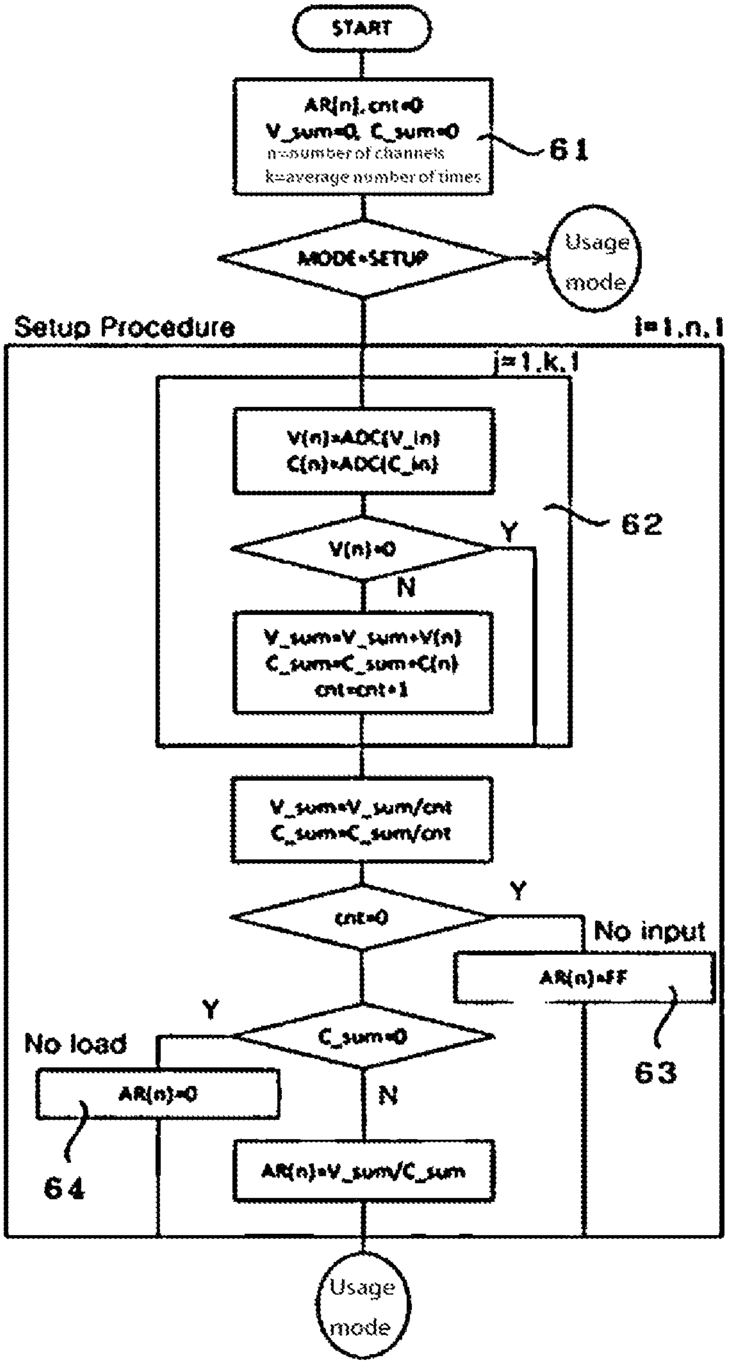
FIG. 6 is a diagram illustrating a generation step process which needs to be first executed in order to store and generate a reference value in the early stage of abnormal analysis according to the present invention.
Figure 8:
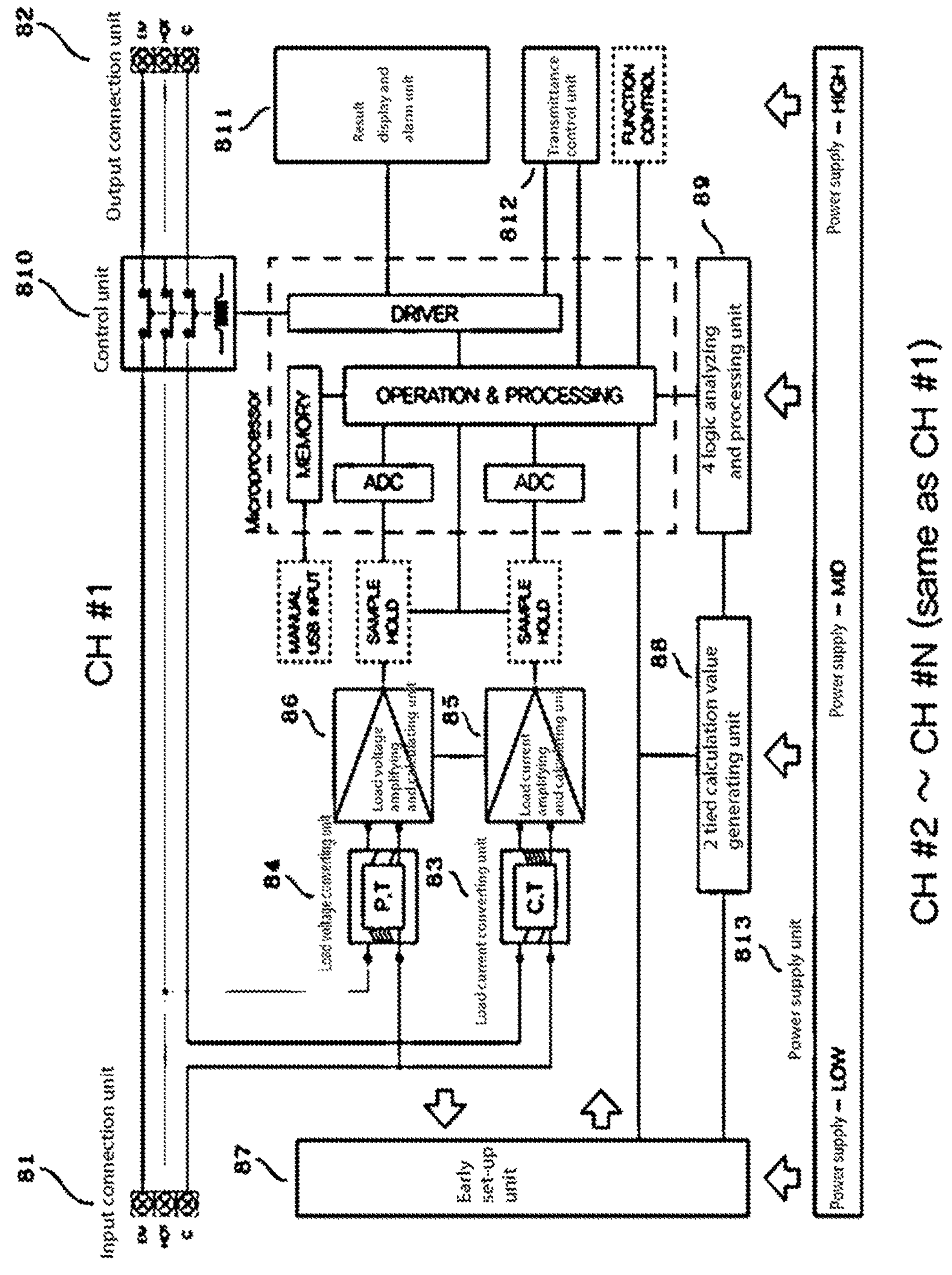
FIG. 8 is a configuration diagram of a device for analyzing and processing an abnormal load illustrating an overall outline in terms of a configuration required for analyzing and processing the abnormal load according to the present invention.

Further, in one example according to a preferred implementation method of the process that implements the generation step of the abnormal load analyzing and processing method, as illustrated in FIG. 6, memory place initialization is performed by memory initialization 61, error offset average value calculation 62 for reducing an error of the 2 tied calculation value described in FIG. 5 is performed based on the load pattern 2 elements 11 of FIG. 3, no-input processing 63 is performed when there is no input level signal from the output amplifier of the premises broadcasting device, no-load processing 64 is performed when there is no load including the short by examining the load side to store and generate the early 2 tied calculation value 12 obtained in FIG. 16 in the 2 tied calculation value generating unit 88 of FIG. 8 as a reference value in the early stage of the execution after synchronization with the device.

Figure 7:
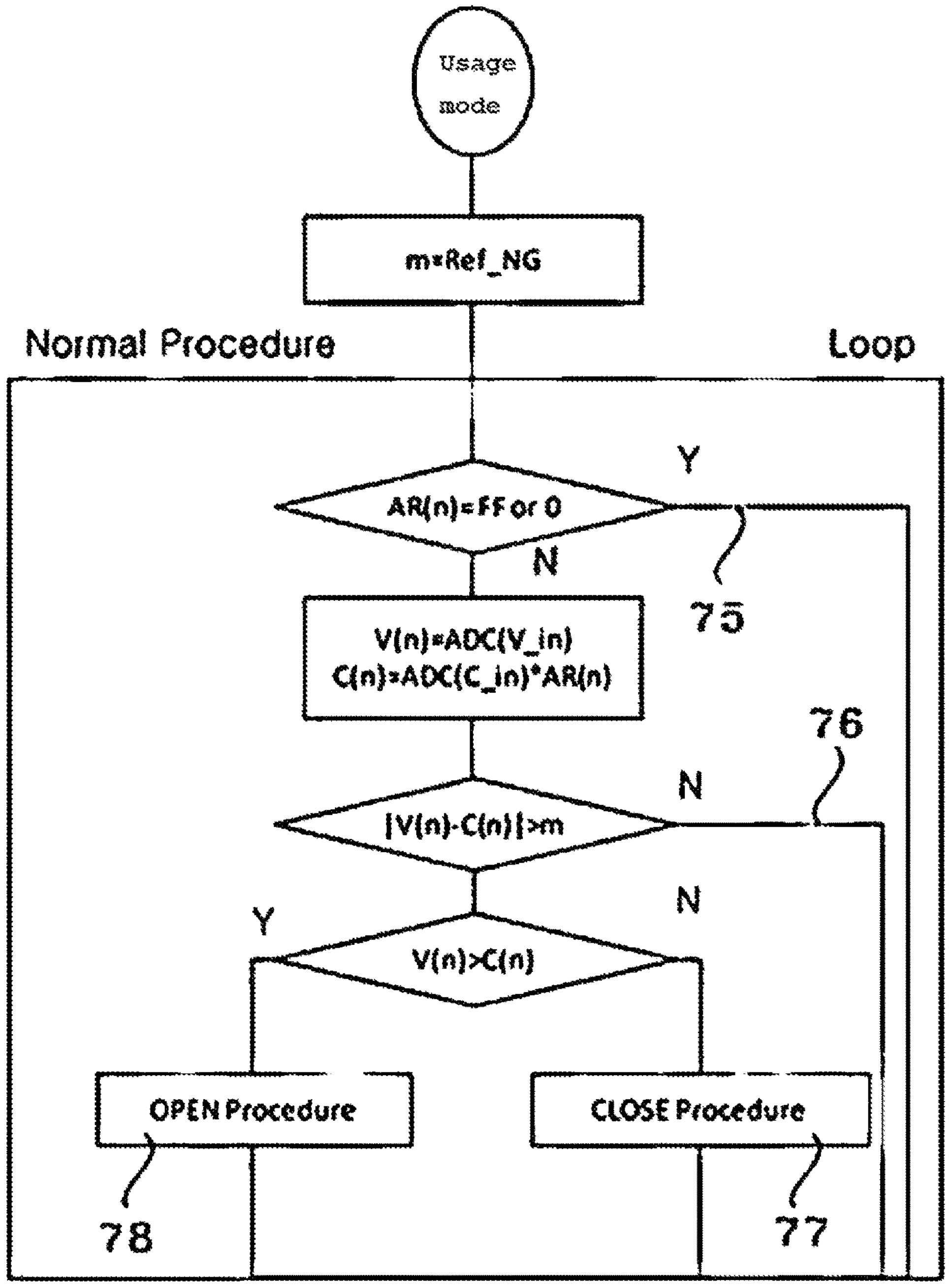
FIG. 7 is a diagram illustrating an analyzing and processing step process which needs to be executed in order to obtain an analysis result of stand-by, short, disconnection, and normal states in usage according to the present invention.

In addition, in one preferable example of the process that implements the analyzing and processing step of the abnormal load analyzing and processing method, when the case in which there is no input level signal from the output amplifier of the premises broadcasting device and the case in which there is no load including the short are aggregated, no-input and no-load processing 75 is performed and a normal state limitless loop 76 is formed as illustrated in FIG. 7 and the early 2 tied calculation value 12 obtained in the 2 tied calculation value generating unit of FIG. 16 is stored and generated due to the early set-up process of the generation step of FIG. 6 and the analyzing and processing process of the 2 condition inputs 21, the 4 logic outputs 22, and the abnormal analysis command signal 23 is executed, however, when a voltage-current load pattern shown in the diagram of the 2 tied calculation value of FIG. 5 is $V1/I1=\Delta Q1$, $V2/I2=\Delta Q2$, $V3/I3=\Delta Q3$, $Vn/In=\Delta Qn$, it is determined to be normal in the case where (usage real-time $\Delta Q1$, $\Delta Q2$, $\Delta Q3$, $\Delta Qn$)=early reference value and it is determined to be abnormal and a short procedure 77 is performed in the case where (usage real-time $\Delta Q1$, $\Delta Q2$, $\Delta Q3$, $\Delta Qn$)>early reference value.

Further, in the case where (usage real-time $\Delta Q1$, $\Delta Q2$, $\Delta Q3$, $\Delta Qn$)<early reference value, it is determined to be abnormal (short or downward fluctuation load) to perform an open procedure 78.

The early reference value is the early 2 tied calculation value 12 generated by the 2 tied calculation value generating unit of FIG. 16.

Moreover, when the load exits, in the case where the input signal level is smaller than a processing reference value, it is determined that the result is in the stand-by state while there is no signal. The result of the process needs to be the same as a 4 logic output result table of Table 2.

An embodiment of a configuration of a device for analyzing and processing an abnormal load according to the present invention is described below.

As illustrated in FIGS. 8 to 21, the device for analyzing and processing an abnormal load includes: input connection units 81 individually connected with respective output terminals of the amplifier of the premises broadcasting device; output connection units 82 connecting the plurality of input connection units 81 and the plurality of loudspeaker loads; load current converting units 83 of individual loudspeakers connected to the input connection units 81 in series; load voltage converting units 84 of the individual loudspeakers connected to the input connection units 81 in parallel; a load current amplifying and calculating unit 85 receiving a converted current change and performing proportional target calculation and outputting of the received current change; a load voltage amplifying and calculating unit 86 receiving converted voltage and performing of proportional target calculation and outputting of the received voltage; an early set-up unit 87 providing a reference value in the early stage of analyzing and processing to a next step as a storage value output 150 and storing and generating the provided reference value (see FIG. 15); a 2 tied calculation value generating unit 88 receiving the storage value output 150 and storing and generating an early 2 tied calculation value 12 in the early stage of the analysis in the early set-up unit 87 and generating a real-time 2 tied calculation value 13 in analysis real time and providing the corresponding data to an analysis step (S20) as 2 condition inputs 21; a 4 logic analyzing and processing unit 89 receiving and analyzing the early 2 tied calculation value 12 and the real-time 2 tied calculation value 13 as the 2 condition inputs 21 to determine stand-by, short, disconnection, or normal states and give a processing command as an abnormal analysis command signal 23; a control unit 810 opening or maintaining electrical connection of the output connection unit 82 and the input connection unit 81 according to a 4 logic analyzing and processing result; a result display and alarm unit 811 capable of visually and auditorily identifying the 4 logic analyzing and processing result; a transmittance control unit 812 transmitting or remotely input controlling analyzing and processing result data through wired/wireless communication; and a power supply unit 813 multiple constant power voltage.

In this case, the input connection units 81 individually connected with the respective output terminals of the amplifier of the premises broadcasting device perform a primary function as connection units individually connected with the respective output terminals of the amplifier of the premises broadcasting device.

In general, the input connection units may be configured to be as many as lines of the speaker selector of the premises broadcasting device or channels of the distribution lines of the individual loudspeakers of the houses or more than channels of the output amplifier of the premises broadcasting device.

In addition, as a secondary function of the input connection units 81, an abnormal load analyzing and processing signal is supplied to the load current converting unit 83 and the load voltage converting unit 84 and output power of the amplifier of the premises broadcasting device is supplied to the output connection units 82 through the control unit 810, and as a result, the input connection units 81 is configured to have a relative relationship of control with the output control unit s82.

Figure 9:
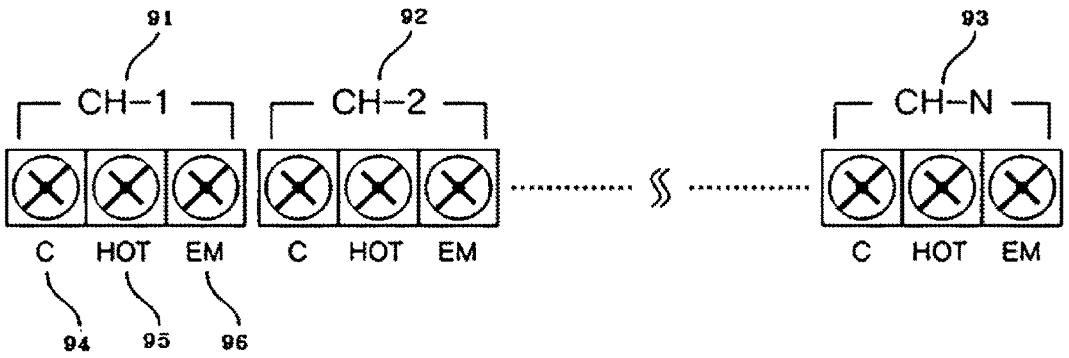
FIG. 9 is a configuration diagram of an input connection unit to which an output of an amplifier of a premises broadcasting device is individually connected.

In the case of a preferable example of the input connection units 81, as shown in FIG. 9, three terminals as the primary function, that is, each of C 94 as the common terminal, HOT 95 as the normal terminal, and EM 96 as the emergency terminal is constituted by one channel and is implemented as multiple individual channel input terminals, that is, CH-1 (91), CH-2(92), . . . CH-N(93), and as a result, the number of channels may be applied or increased as necessary.

In this case, since an array pattern of all of the individual channel input terminals is similar as three terminals, C 94 as the common terminal, the HOT 95 as the normal terminal and the EM 96 as the emergency terminal are disposed at the same array and in the case of a plug-in scheme, all of the individual channel input terminals are integrated as one or in the form of a binding connector for each group and a corresponding distribution line material is together provided to be connected with the output side of the amplifier of the premises broadcasting device as necessary and each terminal or distribution line material is distinguished with the corresponding color.

Moreover, as the secondary function, in the step of connecting and providing the abnormal load analyzing and processing signal to the load current converting unit 83 and the load voltage converting unit 84, electrical interference among respective channels is configured to be minimized by relative small current design corresponding to signal processing and output power of the output amplifier of the premises broadcasting device is configured to be housed and mutually controlled by adjusting an allowable current capacity to load capacities of the individual loudspeakers of the houses with the output connection units 82.

A current capacity of a connection point of the input connection units 81 and a connection system with the output connection units 82 are configured to be 100 [A] or less by considering up to a low impedance load (2 to 16Ω) and inter-terminal withstand voltage is configured to be 200 [V] or less and in the case of the universal terminal based on maximum output voltage of 100 [V] of the output amplifier of the premises broadcasting device, up to a load of a maximum of 10 [KW] may be individually analyzed and processed.

In this case, in the terminals C 94, HOT 95, and EM 96 of each of channels CH-1(91) to CH-N(93), a mutual conduction resistance value exceeds 1000[Ω] or is configured by using electrical insulation as a principle, and as a result, indomitable circulation current and leakage current need to be minimized in spite of simultaneously applying multiple amplifiers.

In addition, the output connection units 82 primarily perform the function as the connection units to which the individual loudspeaker loads and the loudspeaker loads of the houses including the distribution lines of the premises broadcasting device are individually connected.

Therefore, the output connection units may be configured to be as many as the lines of the speaker selector of the premises broadcasting device or the channels of the distribution lines of the individual loudspeakers of the houses or more than channels of the output amplifier of the premises broadcasting device.

Moreover, the secondary function is configured as a relative relationship of control having the input connection unit 81 and the connection unit 810 as a correlation condition.

Figure 10:
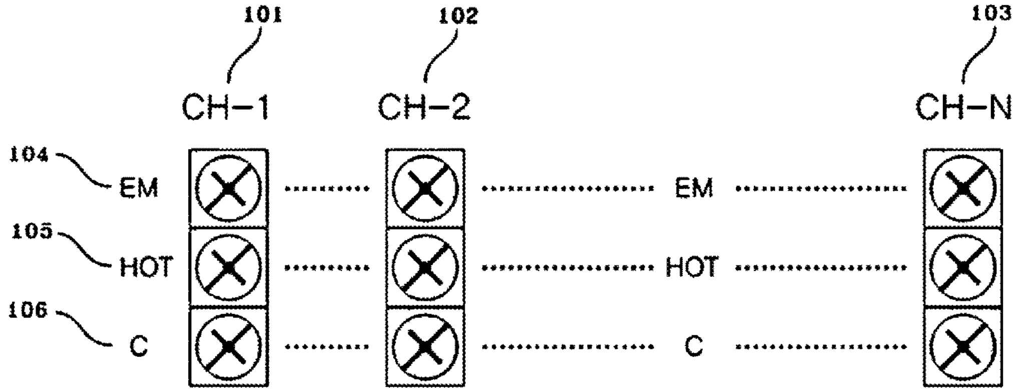
FIG. 10 is a configuration diagram of an output connection unit to which a house loudspeaker load including a distribution line is individually connected.

In the case of a preferable example of the output connection units 82, as illustrated in FIG. 10, three terminals as the primary function, that is, each of C 106 as the common terminal, HOT 105 as the normal terminal, and EM 104 as the emergency terminal is constituted by one channel and is implemented as multiple individual channel input terminals, that is, CH-1(101), CH-2(102), . . . CH-N(103), and as a result, the number of channels may be applied or increased as necessary.

In this case, since an array pattern of all of the individual channel input terminals is similar to the input connection units 82 as three terminals, the C 106, the HOT 105, and the EM 104 are disposed at the same array and in the case of the plug-in scheme, all of the individual channel input terminals are integrated as one or in the form of a binding connector for each group and a corresponding distribution line material is together provided to be connected with the individual loudspeaker loads of the houses and each terminal or distribution line material is distinguished with the corresponding color.

In this case, as the secondary function, the output power of the output amplifier of the premises broadcasting device supplied from the input connection units 81 through the control unit 810 is configured to be transferred to the individual loudspeakers of the houses by applying the allowable current capacity as the load capacities of the individual loudspeakers of the houses with the input connection units 81.

In addition, a current capacity of a connection point of the output connection units 82 and a connection system with the input connection units 81 are configured to be 100 [A] or less by considering up to a low impedance load (2 to 16Ω) and inter-terminal withstand voltage is configured to be 200 [V] or less and in the case of the universal terminal based on maximum output voltage of 100 [V] of the output amplifier of the premises broadcasting device, up to a load of a maximum of 10 [KW] may be individually analyzed and processed.

Further, in the terminals C 106, HOT 105, and EM 104 of each of channels CH-1(101), CH-2(102), . . . CH-N(103), a mutual conduction resistance value exceeds 1000[Ω] or is configured by using electrical insulation as a principle, and as a result, indomitable circulation current and leakage current need to be minimized in spite of simultaneously applying multiple amplifiers.

Moreover, the load current converting unit 83 of the individual loudspeakers connected to the input connection units 81 in series obtains individual converted current values which are in proportion to the individual load current values that flow on the individual loudspeaker loads of the houses of the premises broadcasting device, which are received through the input connection units 81 as voltage components to provide the values to the load current amplifying and calculating unit 85 as the first element among the load pattern 2 elements 11.

Figure 11:
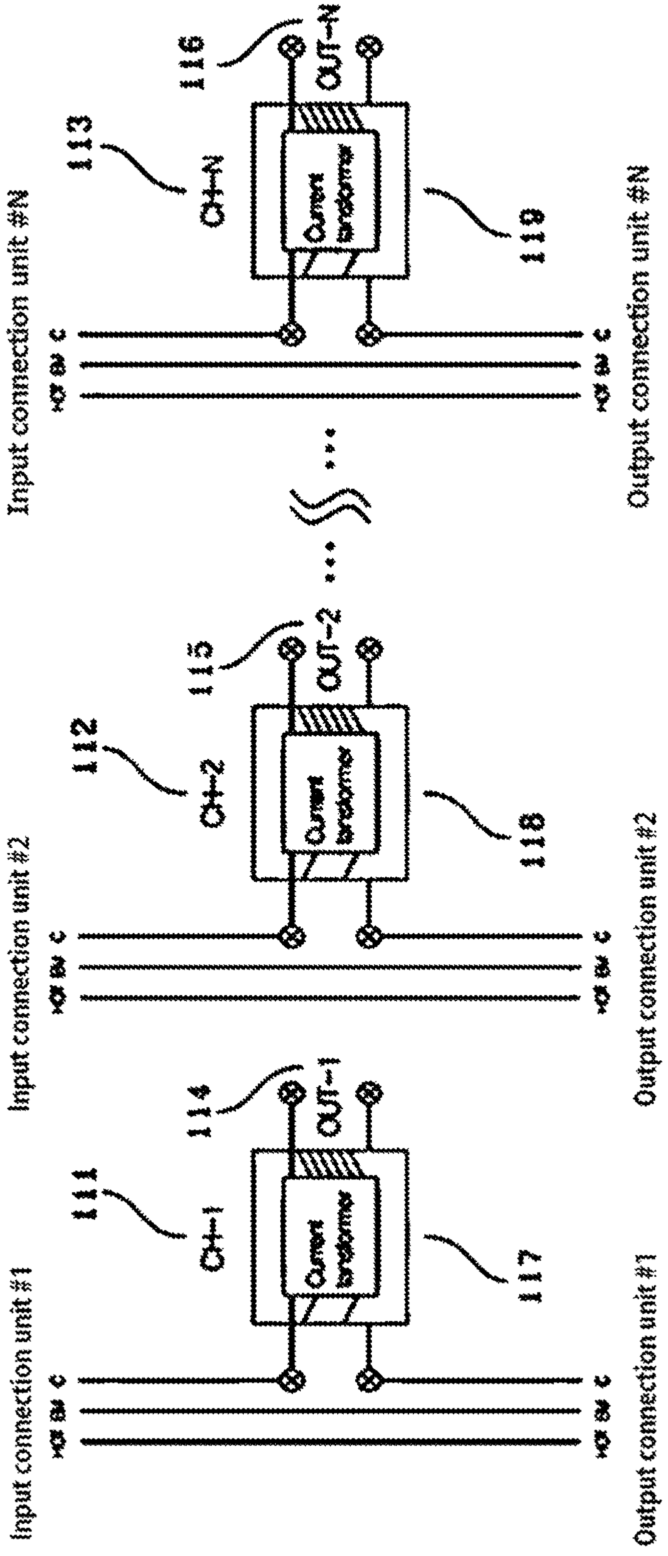
FIG. 11 is a configuration diagram of a load current converting unit that obtains an analyzing and processing converted current value which is in proportion to a load current value according to the present invention.

The load current converting unit 83 of the abnormal load analyzing and processing device, as illustrated in FIG. 11, inserts a primary coil corresponding to at least one of current transformers 117, 118, and 119 for each of all channels 111, 112, and 113 between the input connection units 81 and the control unit 810 in series in order for the output amplifier of the premises broadcasting device to simultaneously obtain individual analysis current outputs 114, 115, and 116 which are in proportion to the loudspeaker load current through the individual house distribution lines and pin layout structures coincide with each other so that polarities of the primary coil and a secondary coil are the same as each other.

In the load current converting unit 83, in the case of the normal load, current corresponding to loudspeaker output capacities [W] of the individual houses or in the case of a short load state, full load current corresponding to short current flows on each primary coil and since an effect value of the current varies in synchronization with the audio signal which frequently varies regardless of the normal load or the abnormal load, in the secondary coil, signal current having the change phase is converted at a predetermined rate suitable for the abnormal load analyzing and processing to supply the value to an input terminal of the load current amplifying and calculating unit 85 of the abnormal load analyzing and processing device.

Further, a characteristic which is first important in the load current converting unit 83 is minimization of insertion loss.

In a minimized magnetic loop within a range to permit part mounting, secondary conversion is preferably achieved within a range in which the number of coils of the primary coil does not exceed one time or two times and it is necessary to endure a maximum allowable current value and a short current value of the load of the house.

10 [A] or less needs to be applied to a premises broadcasting device based on 100 [V] and up to 100 [A] needs to be applied to the low impedance load (2 to 16Ω).

As a second important characteristic, the device is preferably designed and configured so that a flat current conversion ratio characteristic in an entire area of audible audio frequency and up to 100 KHz as possible and usable sensitivity which is less influenced by a secondary circuit load connected to the secondary coil are obtained.

Moreover, the load voltage converting unit 84 of the individual loudspeakers connected to the input connection units 81 in parallel obtains individual converted voltage values which are in proportion to the individual load voltage values that are applied to both ends of the individual loudspeaker loads of the houses of the premises broadcasting device, which are received through the input connection units 81 as voltage components to provide the values to the load voltage amplifying and calculating unit 86 as the second element among the load pattern 2 elements 11.

Figure 12:
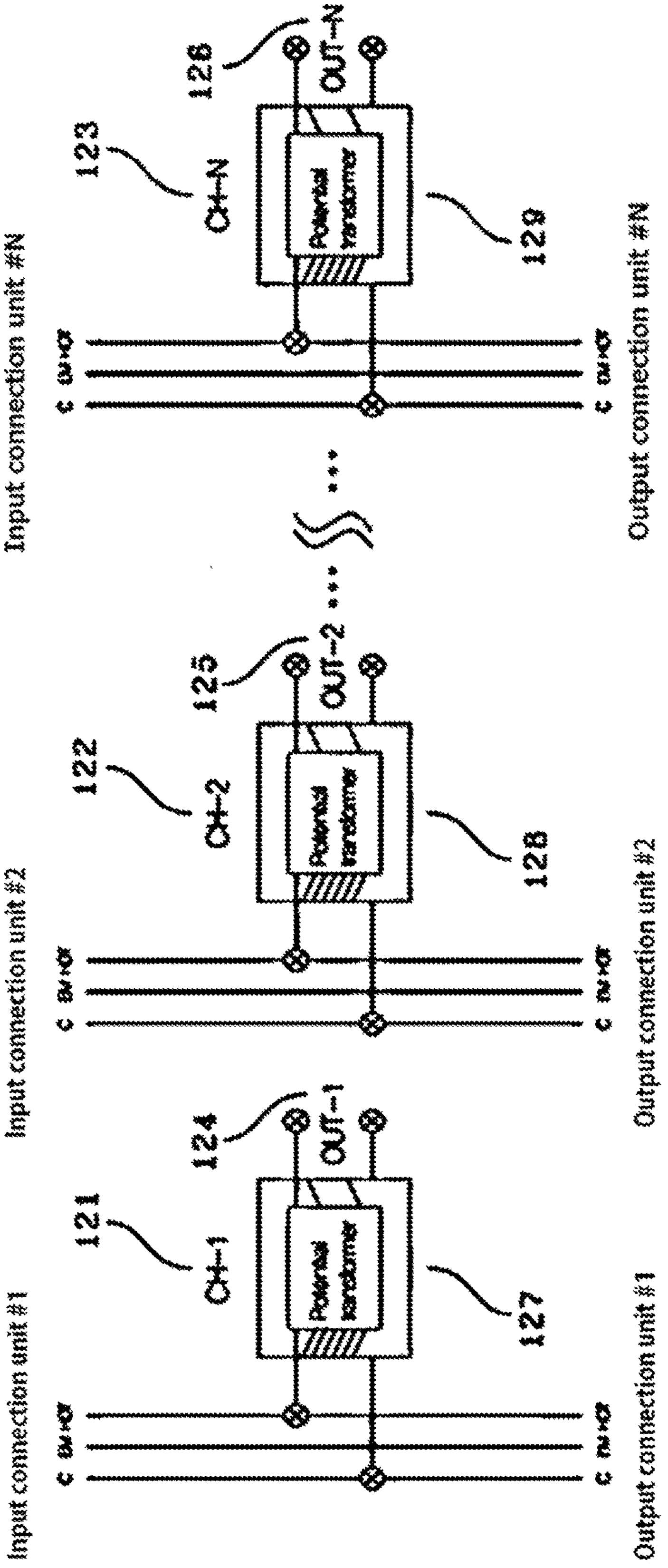
FIG. 12 is a configuration diagram of a load voltage converting unit that obtains an analyzing and processing converted voltage value which is in proportion to a load voltage value according to the present invention.

In the load voltage converting unit 84 of the device for analyzing and processing the abnormal load, as illustrated in FIG. 12, the first coil part of the potential transformers 127, 128, and 129 for the entire channels 121, 122, and 123 is connected to each of both terminals C+EM or C+HOT of the input connection unit 81 in parallel in order to obtain individual voltage outputs 124, 125, and 126 for analyzing which are proportional to the voltage [V] corresponding to the output of the amplifier of the premises broadcasting device, and the pin arrangement structures of the primary and secondary winding coils coincide with each other to unify the polarities.

In the load voltage converting unit 84, the voltage [V] corresponding to the output of the amplifier of the premises broadcasting device of the individual house is supplied to each primary coil, and as necessary, it is necessary to minimize the voltage applied to both terminals of the primary coil by inserting a decompression element having a non-inductive impedance value. In this case, the secondary coil is constituted to supply the value to the input terminal of the load voltage amplifying and calculating unit 86 of the device for analyzing and processing the abnormal load by transforming the change signal voltage applied to the input connection nit 81 at a predetermined ratio suitable for the abnormal load analyzing and processing.

It is preferred that the important properties in the load voltage converting unit 84 are designed and constituted to obtain a transformation ratio which is flat up to possible 100 KHz as well as the entire audible audio frequency area and sensitivity less affected by the secondary circuit load (the load voltage amplifying and calculating unit) connected to the secondary coil.

Further, since the potential transformers 127, 128, and 129 are applied for promoting the stable operation of the load voltage amplifying and calculating unit 86 by easily maintaining electric insulation from the output of the amplifier of the premises broadcasting device, a non-insulation type of decompression means or converting means with at least equivalent effect may also be applied to the load voltage converting unit.

Meanwhile, the load current amplifying and calculating unit 85 calculating and outputting the proportional target by receiving the converted current change performs the matching process for satisfying the transfer characteristic required in the signaling process before and after receiving the converted current output of the load current converting unit 83 and the filtering process of removing unnecessary components, and performs a function of transferring the converted data value corresponding to the available load current to the A-D converter sample hold at the current side of the corresponding analyzing processor by constituting predetermined attenuating and element protecting devices required for the amplifying element 136 (see FIG. 13) to be included in the circuit.

Figure 13:
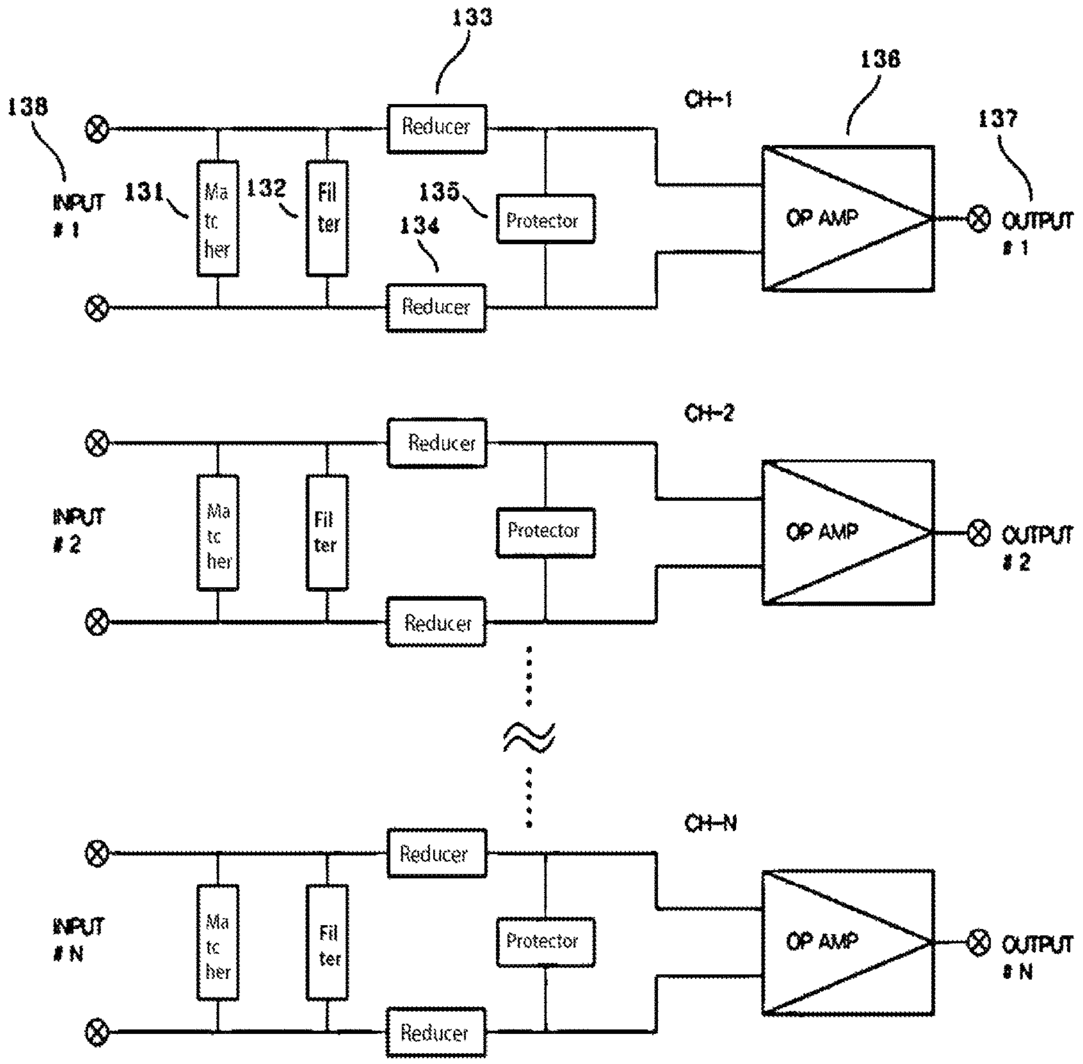
FIG. 13 is a configuration diagram of a load current amplifying and calculating unit that performs target-calculation of the corresponding process with a stable output current value by using the obtained converted current value as a current component according to the present invention.

For example, as illustrated in FIG. 13, in order that the amplifying element 136 transfers the stable output current value proportional to the load current by receiving the converted current output 138 of the load current converting unit 83 of the entire channels CH-1 to CH-N to the processor sample hold input terminal, the current unit matching unit 131 performs level matching with the load current amplifying and calculating unit 85 by receiving the secondary current value of the load current converting unit, the current unit filter 132 attenuates unnecessary predetermined peak current and a noise harmonic component, the current unit attenuators 133 and 134 correct a proper input current level of the amplifying element 136 and set the value corresponding to the limit load on the signal current of the load current converting unit 83, the current unit protector 135 absorbs the unnecessary peak current which exceeds the functional limit of the four elements to remove the protection of the amplification terminal and the over-operation phenomenon, and the OP-AMP amplifying unit 136 outputs the output current value proportional to the predetermined input including the required functions to the current side 137 through the load current amplifying and calculating unit 85 to transfer the output current value to the corresponding processor A-D converter through the sample hold process.

In this case, the load current amplifying and calculation unit 85 of the entire channels CH-1 to CH-N is insulated from the input connection unit 81 of the entire channels to minimize unnecessary electric interference in the output amplifier of the premises broadcasting device, the amplification terminal is a balance amplifier, the current unit attenuators 133 and 134 has the same electric characteristic, the limit voltage of the current unit protector 135 has a bi-directional characteristic within 1.2 [Volt], and the current unit matcher 131 and the current unit filter 132 add a reactor L as R+C if necessary to be flexibly applied according to the OP-AMP amplifying element 136 for amplifying the current to satisfy the used frequency characteristic and the dynamic range.

In addition, the output of the load current amplifying and calculation unit 85 is represented as the transformed voltage, but classified as a function of the amplifying unit of the load current in the device of the present invention.

Meanwhile, the load voltage amplifying and calculating unit 86 calculating and outputting the proportional target by receiving the converted voltage performs the matching process for satisfying the transfer characteristic required in the signaling process before and after receiving the converted output of the load voltage converting unit 84 and the filtering process of removing unnecessary components, and performs a function of transferring the converted data value corresponding to the available load voltage to the A-D converter sample hold at the voltage side of the corresponding analyzing processor by constituting predetermined attenuating and element protecting devices required for the amplifying element 146 (see FIG. 14) to be included in the circuit.

Figure 14:
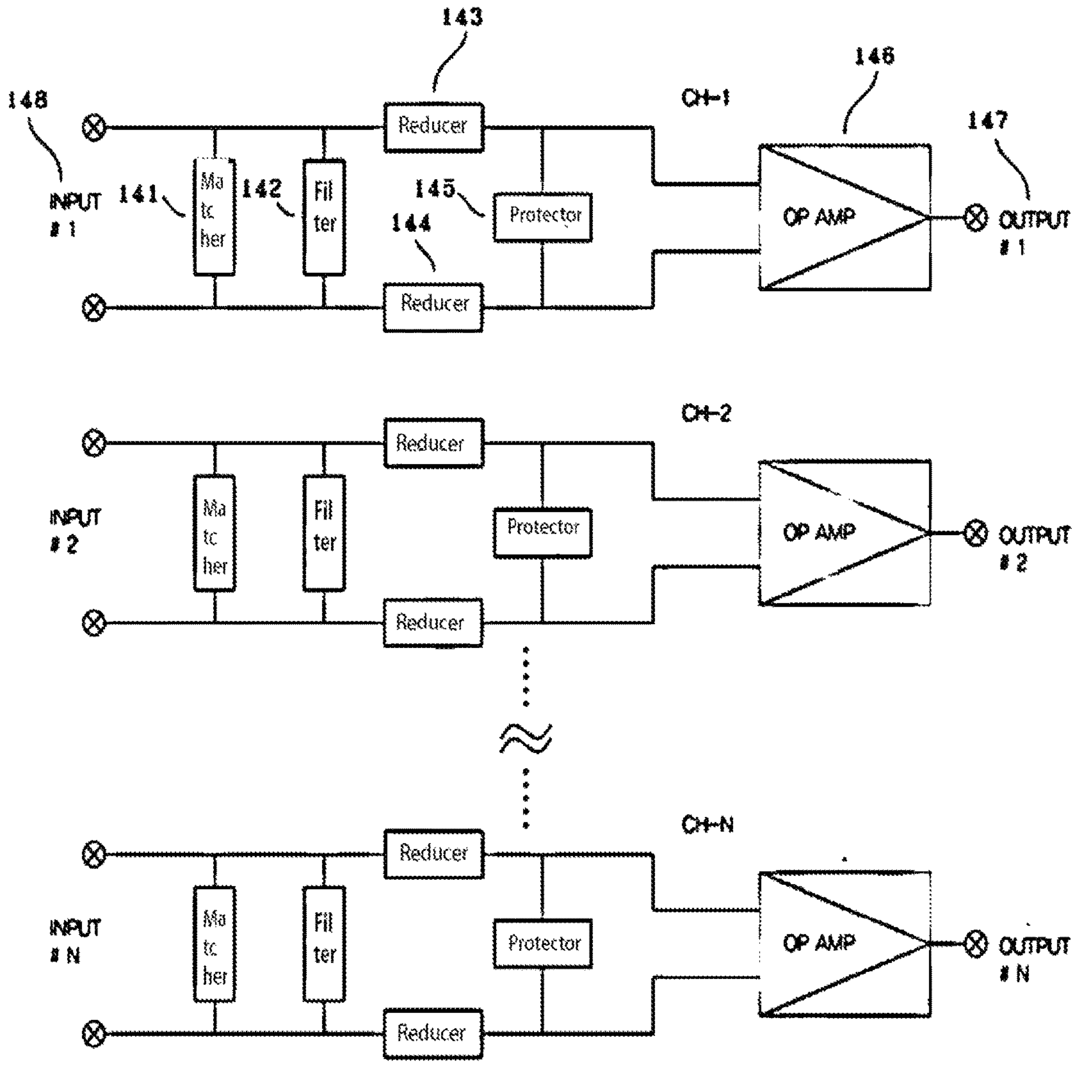
FIG. 14 is a configuration diagram of a load voltage amplifying and calculating unit that performs target-calculation of the corresponding process with a stable output voltage value by using the obtained converted voltage value as a voltage component according to the present invention.

In this case, as illustrated in FIG. 14, in order that the amplifying element 146 transfers the stable output voltage value proportional to the load voltage by receiving 148 the converted output of the load voltage converting unit 83 of the entire channels CH-1 to CH-N to the processor sample hold input terminal, the voltage unit matching unit 141 performs level matching with the load voltage amplifying and calculating unit 86 by receiving the secondary voltage value of the load voltage converting unit, the voltage unit filter 142 attenuates unnecessary predetermined peak voltage and noise harmonic component, the voltage unit attenuators 143 and 144 correct a proper input voltage level of the amplifying element and set the value corresponding to the limit load on the signal voltage of the load voltage converting unit 84, the voltage unit protector 145 absorbs the unnecessary peak voltage which exceeds the functional limit of the four elements to remove the protection of the amplification terminal and the over-operation phenomenon, and the OP-AMP amplifying element 146 outputs the output voltage value proportional to the predetermined input including the required functions to the voltage side 147 through the load voltage amplifying and calculating unit 86 to transfer the output voltage value to the corresponding processor A-D converter through the sample hold process.

In this case, the load voltage amplifying and calculation unit 86 of the entire channels CH-1 to CH-N is insulated from the input connection unit 81 of the entire channels to minimize unnecessary electric interference in the amplifier of the premises broadcasting device, the amplification terminal is a balance amplifier, the voltage unit attenuators 143 and 144 have the same electric characteristic, the limit voltage of the voltage unit protector 145 has a bi-directional characteristic within 1.2 [Volt], and the voltage unit matcher 141 and the voltage unit filter 142 add a reactor L as R+C if necessary to be flexibly applied according to the OP-AMP amplifying element 146 for amplifying the voltage to satisfy the used frequency characteristic and the dynamic range.

Meanwhile, an early set-up unit 87 providing, storing, and generating a reference value at the early stage of analyzing and processing to the next step as the storage value output 150 (see FIG. 15) perform a value corresponding to the analyzing and processing to a 2 tied calculation value generating unit 88 by outputting 150 a unique reference value of the early normal load as the early load pattern 2 element values through the automatic early set-up process or outputting 150 the same value as the reference value to the storage value through the passive early set-up process by an external input means.

In this case, the reference value of the normal load at the early stage of the abnormal load analyzing and processing becomes a relative reference value of the abnormal analysis of the used real-time load.

Accordingly, in the case of the automatic generation of the early reference value, a device is constituted to store and generate the reference value as the storage value output 150 in the 2 tied calculation value generating unit 88 by the load voltage value and the load current value of the load pattern 2 elements 11 of the early-stage normal load.

In the case of the passive generation of the early reference value, a device is constituted to store and generate the same storage value output 150 as the reference value of the normal load in the 2 tied calculation value generating unit 88 by constituting a separate external unique value instead of the load voltage value and the load current value of the normal load to be directly associated with the storage value output 150 of the early step-up unit 87.

Figure 15:
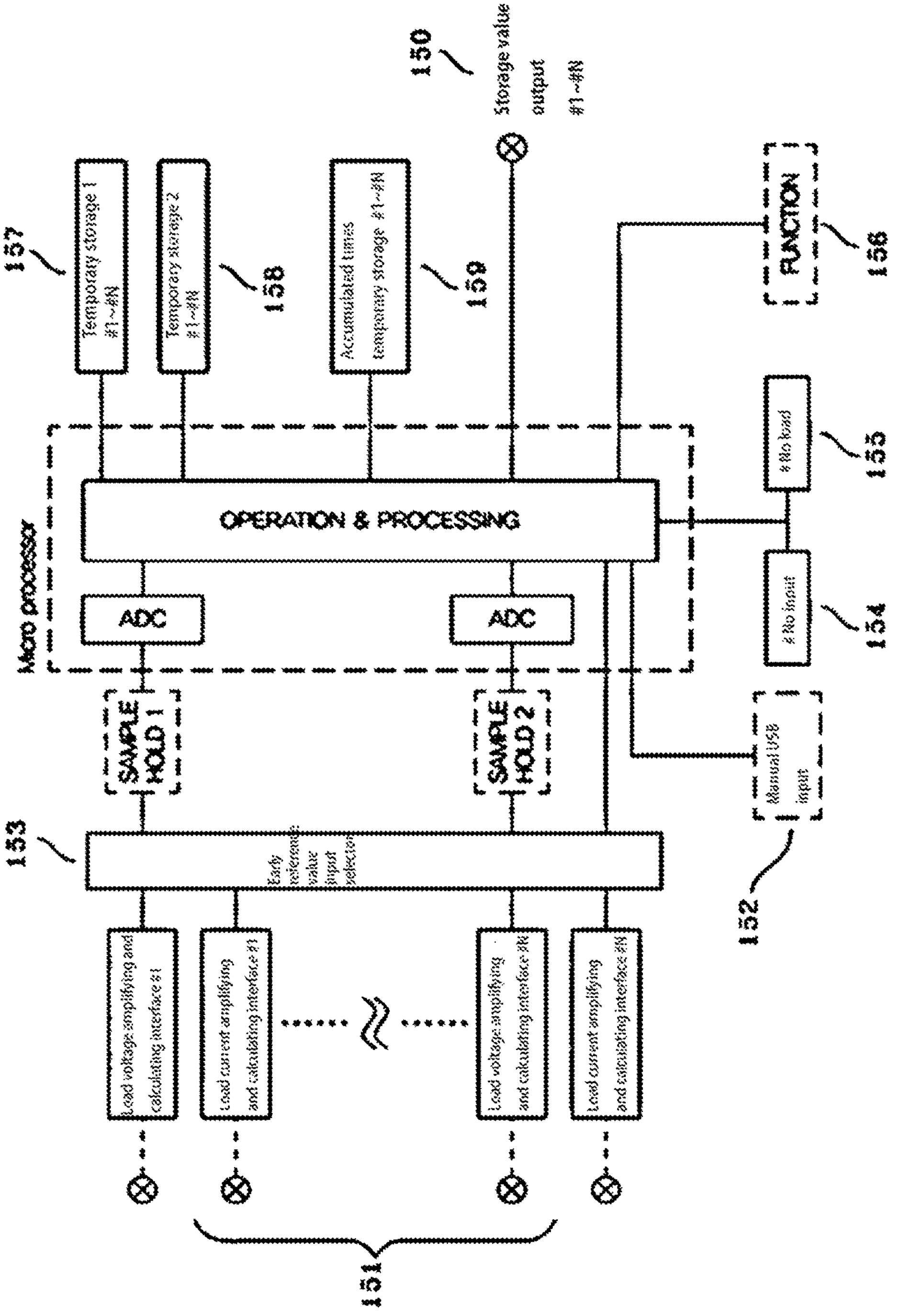
FIG. 15 is a configuration diagram of an early set-up unit that stores and thereafter, generates a reference value in the early stage of abnormal analysis in a corresponding memory of a next device as a stored and output value.

In this case, in the case of the automatic generation of the early reference value, as illustrated in FIG. 15, the load current value and the load voltage value 151 by the load pattern 2 elements of the separate normal load is target-converted by receiving the amplifier output of the premises broadcasting device at the early stage of the abnormal load analyzing and processing to form the conversion value at the early stage and then the storage value output 150 for analyzing and processing the abnormal load is obtained by a load voltage value temporary storage 157, a load current value temporary storage 158, and a separate cumulative number temporary storage 159 through the signaling process. The storage value output 150 is constituted to provide the value to the 2 tied calculation value generating unit 88 which is a configuring device of the next analyzing and processing process and the 2 tied calculation value generating unit 88 is constituted to store, generate, and confirm the value in the non-volatile memory.

Further, in the case of the passive generation of the early reference value, at the early stage of the abnormal load analyzing and processing, the early reference value of the separate normal load is directly received through the manual USB input 152 or a wired/wireless communication means as illustrated in FIG. 15 and set as the storage value output 150 without passing through the temporary storages 157 and 158 or the cumulative number temporary storage 159 to be provided to the 2 tied calculation value generating unit 88 which is the configuring device of the next analyzing and processing process, and the 2 tied calculation value generating unit 88 is constituted to store, generate, and confirm the early reference value in the non-volatile memory.

Furthermore, the early set-up unit 87 may have an automatic input type of the early reference value through the automatic early set-up process and the passive generation which is the early set-up passive input type without passing through the temporary storage or the cumulative storage average value calculating process without generating the load pattern 2 elements 11 through the separate external input means to also be constituted by providing a bi-directional selection device or in combination without an input selector to analyze and process the abnormal load which is optimal to the use environment by selecting the early reference value input selector 153.

The target-converting of the load current value and load voltage value is to ensure reliability in analysis result by repeatedly accumulating only an effective value in the cumulative number temporary storage 159 enough to ensure the accuracy of the abnormal load analyzing and processing by a predetermined number of times by removing the load current value and load voltage value which is less than the reference value and calculating an average value.

In the temporary storage process, when the same temporary storage group as the number of channels of abnormal load analyzing and processing is set, three separate storages for load voltage, load current, and cumulative number are arranged in the group, the analyzing is performed, the load current value and load voltage value is target-converted to be converted into the load current value to the load voltage value suitable for the process procedure and recorded as the early set-up reference value in the temporary storage arrangement of the unique number.

In this process, when the non-load processing 155 is classified, it is determined that there is no early reference value, and thus, the channel is recorded to 0 and the channel determined as the non-input is separated divided to be recorded as the early set-up reference value corresponding to the non-input processing 154 in the temporary storage arrangement of the unique number.

As a result, the early set-up reference value provides a unique value required for the non-volatile storage space of the 2 tied calculation value generating unit 88 as the storage value output 150 of the early set-up unit 87.

For flow pipe associated operation of the early set-up unit 87, the operation input device control function 156 is provided together.

Further, the early set-up unit 87 stores and generates the early 2 tied calculation value 88 by receiving the storage value output 150 at the early analysis stage and generates a real-time 2 tied calculation value 13 in the analysis real time. The 2 tied calculation value generating unit 88 providing the corresponding data to the 2 condition input 21 during the analysis step (S20), as illustrated in FIG. 16, receives 161 the storage value output 150 formed by the early reference value in the early set-up unit 87 at the early stage of the abnormal load analyzing and processing to store the storage value output 150 in the non-volatile memory 163 and generate the storage value output 150 as the final early 2 tied calculation value 12 to transfer the generated value to first elements 173, 178, and 1713 (see FIG. 17) among the 2 condition input elements 172, 173, 177, 178, 1712, and 1713 (see FIG. 17) of the 4 logic analyzing and processing unit 89.

In addition, the 2 tied calculation value generating unit 88 performs a function of generating a use real-time calculation value 166 (see FIG. 16) for analyzing and processing the abnormal load as the real-time 2 tied calculation value 13 to transfer the use real-time calculation value 166 to second elements 172, 177, and 1712 (see FIG. 17) among the 2 condition input elements 172, 173, 177, 178, 1712, and 1713 (see FIG. 17) of the 4 logic analyzing and processing unit 89.

Particularly, in the configuration diagram of the 2 tied calculation value generating unit 88, the early set-up unit 87 receives the storage value output 150 at the early stage as the early storage value input 161 of the 2 tied calculation value generating unit 88 by forming, converting, and passing the early reference value of the separate normal load as the storage value output 150 and generates and confirms the storage value output 150 as the separate early 2 tied calculation value 12 through the drive interface 167 after target-processing through the EEPROM storage value interface 165 after being separately stored in the non-volatile memory storage arrangement 163. The generated and confirmed early 2 tied calculation value 12 is provided to the 4 logic analyzing and processing unit 89 by 0 to N channels as the first element of the 2 condition input 21.

Further, in FIG. 16, the real-time relative value receiving the real-time calculation value input 162 is converted through the real-time calculation value interface 166 without the storage process in the real-time tied value arrangement 164 as the load value of the analyzing and processing real time to be confirmed and generated as the real-time 2 tied calculation value 13 through the drive interface 167 after being input to the processing process.

The generated real-time 2 tied calculation value 13 is provided to the 4 logic analyzing and processing unit 89 of FIG. 8 by 0 to N channels as the second element of the 2 condition input 21 (see FIG. 1).

As described above, the first generated early 2 tied calculation value output 12 and the later generated real-time 2 tied calculation value output 13 are provided as two inputs of the 2 condition of the 4 logic analyzing and processing unit 89 to calculate the abnormal load analyzing and processing result.

The 2 tied calculation value generating unit 88 (see FIG. 8) may perform a function FUNCTION or synchronization SYNC to flow-operate an external device with the present device if necessary as an end of the generating step of the device for the analyzing and processing the abnormal load.

The generation state after storing the separate early 2 tied calculation value 12 or the generation state of the real-time 2 tied calculation value 13 are informalized in the process of analyzing and processing the abnormal load to be transferred by a display or remotely. In the case where any one or both of the early 2 tied calculation value 12 and the real-time 2 tied calculation value 13 generated in the 2 tied calculation value generating unit 88 is not present, the case corresponds to an abnormal load analysis error to be recorded and listed for each event for managing together with alarming process or state transmission in addition to marking.

Further, the 4 logic analyzing and processing unit 89 which determines as stand-by, short, disconnection, and normality and makes a processing command as the abnormal analysis command signal 23 (see FIG. 3) by receiving and analyzing the early 2 tied calculation value 12 and the real-time 2 tied calculation value 13 as the 2 condition input 21 performs a function of transferring the abnormal analysis command signal to the corresponding elements of the processing step (S30) by receiving the early 2 tied calculation value 12 and the real-time 2 tied calculation value 13 generated in the 2 tied calculation value generating unit 88 of the generating step (S10) as the 2 condition input 21 to classify and output the received values into the 4 logic outputs 22, as shown in FIG. 1 (stand-by, short, disconnection, and normality).

Figure 17:
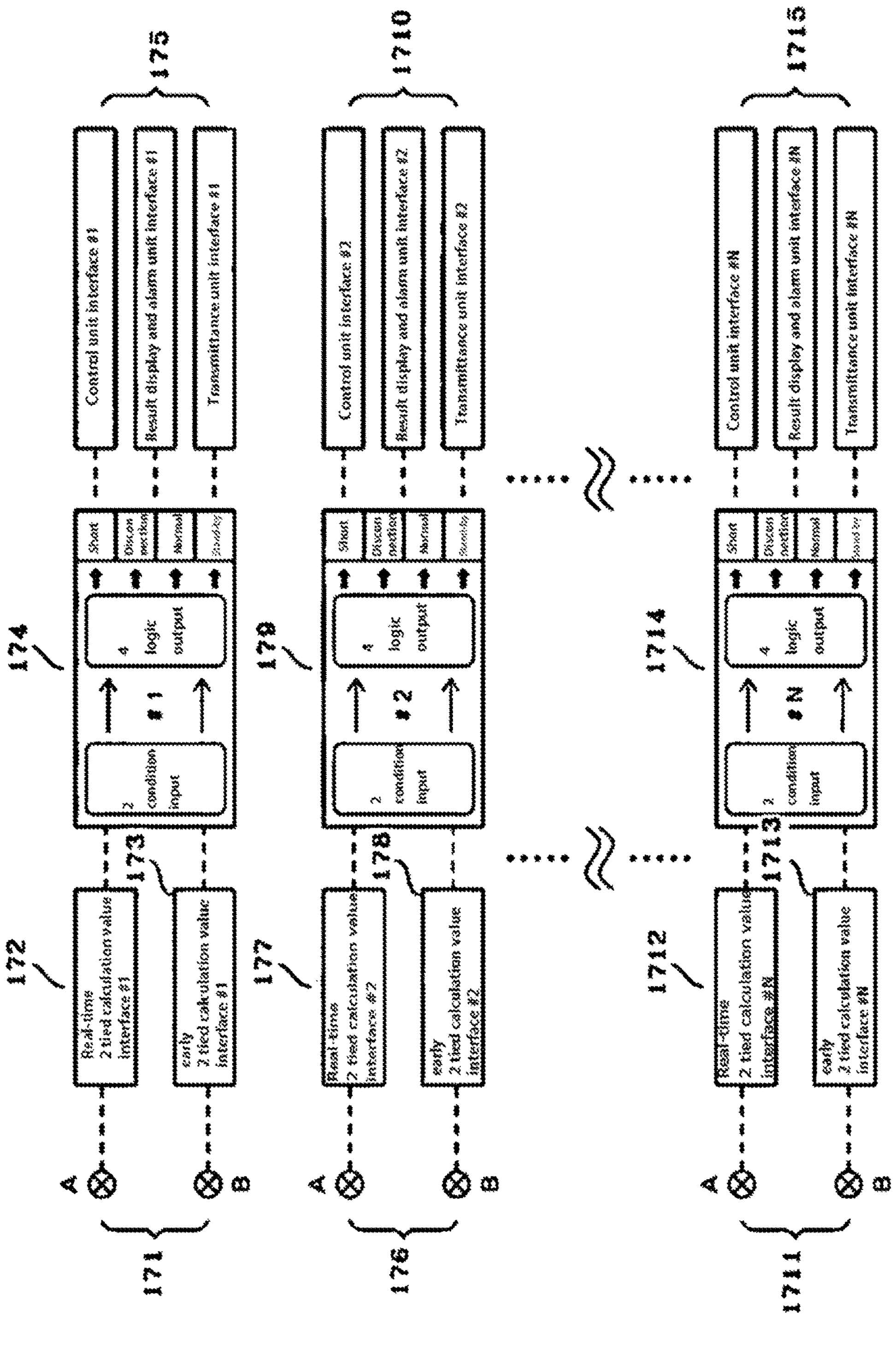
FIG. 17 is a configuration diagram of a 4 logic analyzing and processing unit that receives an early load value and a real-time load value as target conversion 2 condition inputs to transfer stand-by, short, disconnection, and normal states to 3 components of the processing step as an abnormal analysis command signal according to the present invention.

In this case, the 4 logic analyzing and processing unit 89 is constituted to assign the real-time 2 tied calculation values 172, 177, 1712=A and the early 2 tied calculation values 173, 178, 1713=B of FIG. 17 generated in the 2 tied calculation value generating unit 88 as the 2 condition inputs 171, 176, and 1711 for each channel and receive the assigned values as the 2 condition input for the 4 logic analyzing and processing. In this state, an individual target value for analyzing whether the load is abnormal in the use real-time of the abnormal load analyzing and processing becomes the real-time 2 tied calculation values 172, 177, 1712=A and the individual early value of the early stage normal load of the abnormal load analyzing and processing becomes the early 2 tied calculation values 173, 178, 1713=B to receive the values in the 2:4 logic analyzing and processing devices 174, 179, 1714 as the 2 condition input 21 and transfer the 4 analysis results of the stand-by, short, disconnection, and normality as the result of the 4 logic output 22 according to a conditional correlation parameter of the condition input 21 to the control unit 810, the result display alarming unit 811, and the transmittance control unit 812 which are the three constituent elements 175, 1710, and 1715 of the processing step for each channel as the abnormal load command signal 23.

The correlation parameter and the analysis result with the real-time 2 tied calculation values 172, 177, 1712=A and the early 2 tied calculation values 173, 178, 1713=B are classified as the following 4 types.

First, in a first type, the early 2 tied calculation value 12 generated after being stored in the 2 tied calculation value generating unit 88 in the early set-up as A=0 and B=1 is present, but the real-time 2 tied value 13 is not present and thus, a case where either the load current value or the load voltage value is not present, that is, the non-signal step is analyzed and classified as the standby state.

Next, in the second type, since the real-time 2 tied value 13 is larger than the early 2 tied calculation value 12 generated after stored in the early set-up as A>B in real use, a load amount to the early stage is increased to be analyzed and classified into the disconnection or the upward fluctuation load state.

In addition, in the third type, since the real-time 2 tied value 13 is smaller than the early 2 tied calculation value 12 generated after stored in the early set-up as A<B in real use, the load amount to the early stage is decreased to be analyzed and classified into the disconnection or the downward fluctuation load state.

Finally, in the fourth type, since the real-time 2 tied value 13 is equal to the early 2 tied calculation value 12 generated after stored as A=B, the load fluctuation does not occurs to be analyzed and classified into the normal state.

The analysis classified result obtained in the 4 types of processing processes is confirmed as the abnormal analysis command signal 23 and the command values thereof are transferred to the 3 constituent elements 175, 1710, and 1715 in the processing step.

That is, in the case of A=0 and B=1 which are the standby state of the first type, the abnormal analysis command signal of the 4 logic analyzing and processing unit maintains the electrical connection between the input connection unit 81 and the output connection unit 82 by the control unit 810 with an NC contact point, marks or selectively alarms the standby state in the result display alarming unit 811, and transfers the corresponding state to the transmittance control unit 812.

In addition, in the case of A>B in the disconnection or upward fluctuation load state of the second type, the abnormal analysis command signal of the 4 logic analyzing and processing unit 89 interrupts the electrical connection between the input connection unit 81 and the output connection unit 82 by the control unit 810, marks or essentially alarms the disconnection or upward fluctuation load state in the result display alarming unit 811, and transfers the corresponding state to the transmittance control unit 812.

Further, in the case of A<B in the disconnection or downward fluctuation load state of the third type, the abnormal analysis command signal of the 4 logic analyzing and processing unit 89 maintains the electrical connection between the input connection unit 81 and the output connection unit 82 by the control unit 810 with the NC contact point, marks or selectively alarms the disconnection or downward fluctuation load state in the result display alarming unit 811, and transfers the corresponding state to the transmittance control unit 812.

Furthermore, in the case of A=B which is the normal state of the fourth type, the abnormal analysis command signal of the 4 logic analyzing and processing unit 89 maintains the electrical connection between the input connection unit 81 and the output connection unit 82 by the control unit 810 with the NC contact point, marks the normal state in the result display alarming unit 811, and transfers the corresponding normal state to the transmittance control unit 812.

Meanwhile, the control unit 810 opening or maintaining the electrical connection between the input connection unit 81 and the output connection unit 82 according to the 4 logic analyzing and processing result performs a function of controlling the input connection unit 81 and the output connection unit 82 of the device of analyzing and processing the abnormal load by the abnormal analysis command signal 23 obtained as the analysis result in the 4 logic analyzing and processing unit 89.

Figure 18:
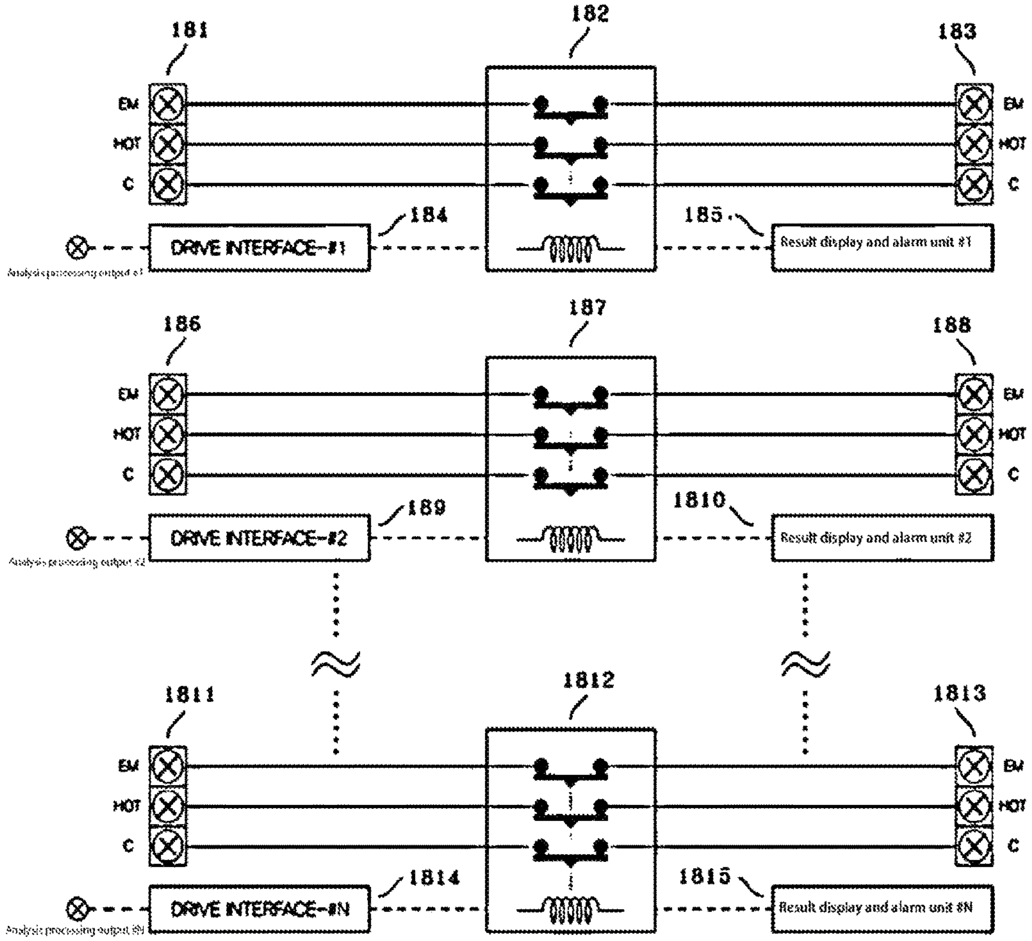
FIG. 18 is a configuration diagram of a control unit that electrically separates or maintains connection of a load including an output amplifier of the premises broadcasting device and loudspeaker distribution lines by using input connection units (FIG. 10) and output connection units (FIG. 11) according to the present invention.

The control unit 810 is a configuration equal or similar to the example of FIG. 18, and a relay is recommended to use the mechanical contact point as long as there are no problems of space and operating current until an insertion loss limit of a semiconductor or a peak voltage breakage limit is overcome.

In the device of the present invention, the relay is constituted to operate only in an emergency such as disconnection, and as illustrated in FIG. 18, the analyzed logic output is input to drive interfaces 184, 189, and 1814 of the driving circuit of the relay, and the replays 182, 187, and 1812 are constituted to operate to control the input connection units 181, 186, and 1811 and the output connection units 183, 188, and 1813 as rapidly as possible and be controlled within 1 second of 200 to 100.

The electronic relay of the control unit of the device of analyzing and processing the abnormal load operates for maintaining the closed circuit when the disconnection, the normality, and the standby or opening the circuit only in the case of disconnection and thus, the contact point in the usual day is in a normal cross state.

In the restoring and re-operating, the control unit depends to a processor command (the abnormal analysis command signal) of the 4 logic analyzing and processing unit without self-parameter or self-authority. The operation or the state of the control unit are constituted to be partially associated with the result display alarming units 175, 1710, and 1715 and constituted to be associated with the transmittance control unit 812 in the previous step.

Further, the result display alarming and processing unit 811 (see FIG. 8) capable of visually and aurally distinguish the 4 logic analyzing and processing result is constituted to visually mark the state and the result analyzed and processed by the abnormal analysis command signal 23 obtained as the analysis result in the 4 logic analyzing and processing unit 89 and aurally performs a function of generating an alarm sound.

Figure 19:
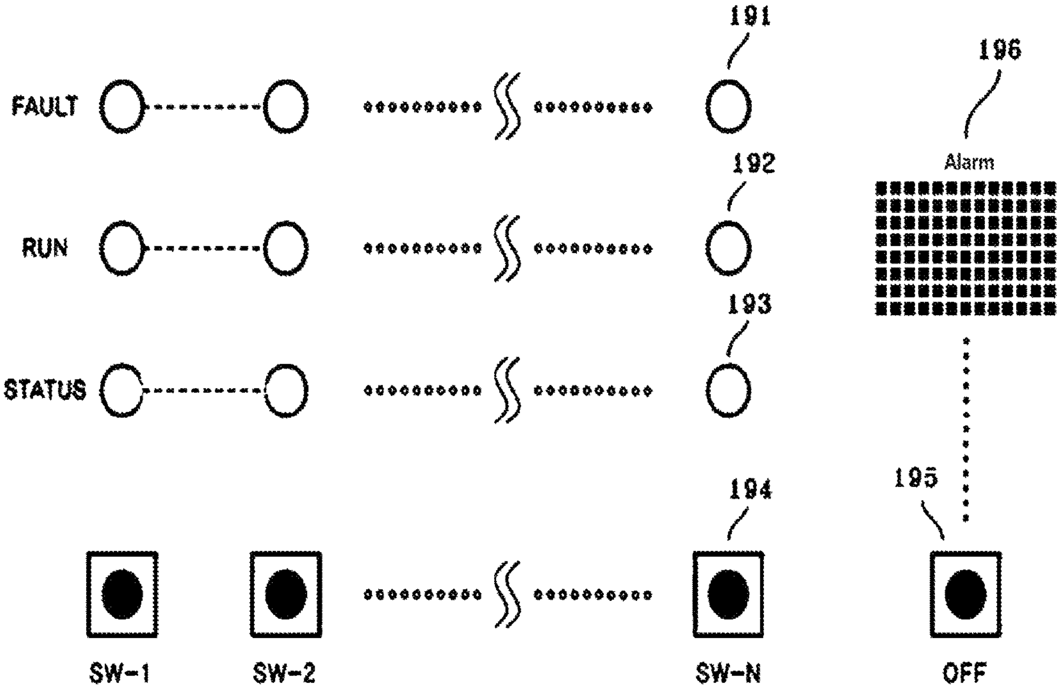
FIG. 19 is a configuration diagram of a result display and alarm unit that visualizes and auralizes an operating state of each channel and an abnormal analyzing and processing result according to the present invention.

The result display alarming unit 811, as illustrated in FIG. 19, is constituted to visually, and separately and regularly display the operation state (channel ON, OFF early set-up, alarm-OFF, or the like) and the abnormal analyzing and processing results (stand-by, short, disconnection, and normality) and aurally and regularly generate the alarm sound.

That is, the analyzing and processing function of the corresponding channel operates by the separate channel switch 194, and the result is constituted by displaying the state as lighting on or off of a short and disconnection display lamp 191, a normal and standby display lamp 192, and a check display lamp 193.

Further, the corresponding alarm sound of the entire channels is emitted through an alarm window 196 at the front of the device and may be interrupted by an alarm sound release button 195 if necessary, and in this case, the lighting display of the alarm sound release button lighted on or off to display a switch caution.

In addition, since the individual channel operates, stops, or bypasses by each channel switch, the individual channel is constituted to select and release the analyzing and processing command, respectively when checking and repairing the abnormal distribution line among the plurality of distribution lines and starts to ON during the early stage operation. The three display lamps of the individual display unit may be applied as one multi-color display element while maintaining intuitiveness and may display the multiple states by varying each lighting-off period.

The alarm sound may be alarmed by dividing the short and the disconnection with the cycle and the length of the control sound. When the result is displayed and operated by applying a text, a graphic display, or a touch type display, the function may be satisfied by simplifying the smaller structure or the control setting unit.

Further, the transmittance control unit 812 to send the analyzed and processed result data through the wired/wireless communication or control the input remotely is constituted to transmit and control the analyzed and processed state and result by the abnormal analysis command signal 23 obtained as the analyzed result in the 4 logic analyzing and processing unit 89 to the external flow pipe device as the data through the corresponding wired/wireless communication means.

Figure 20:
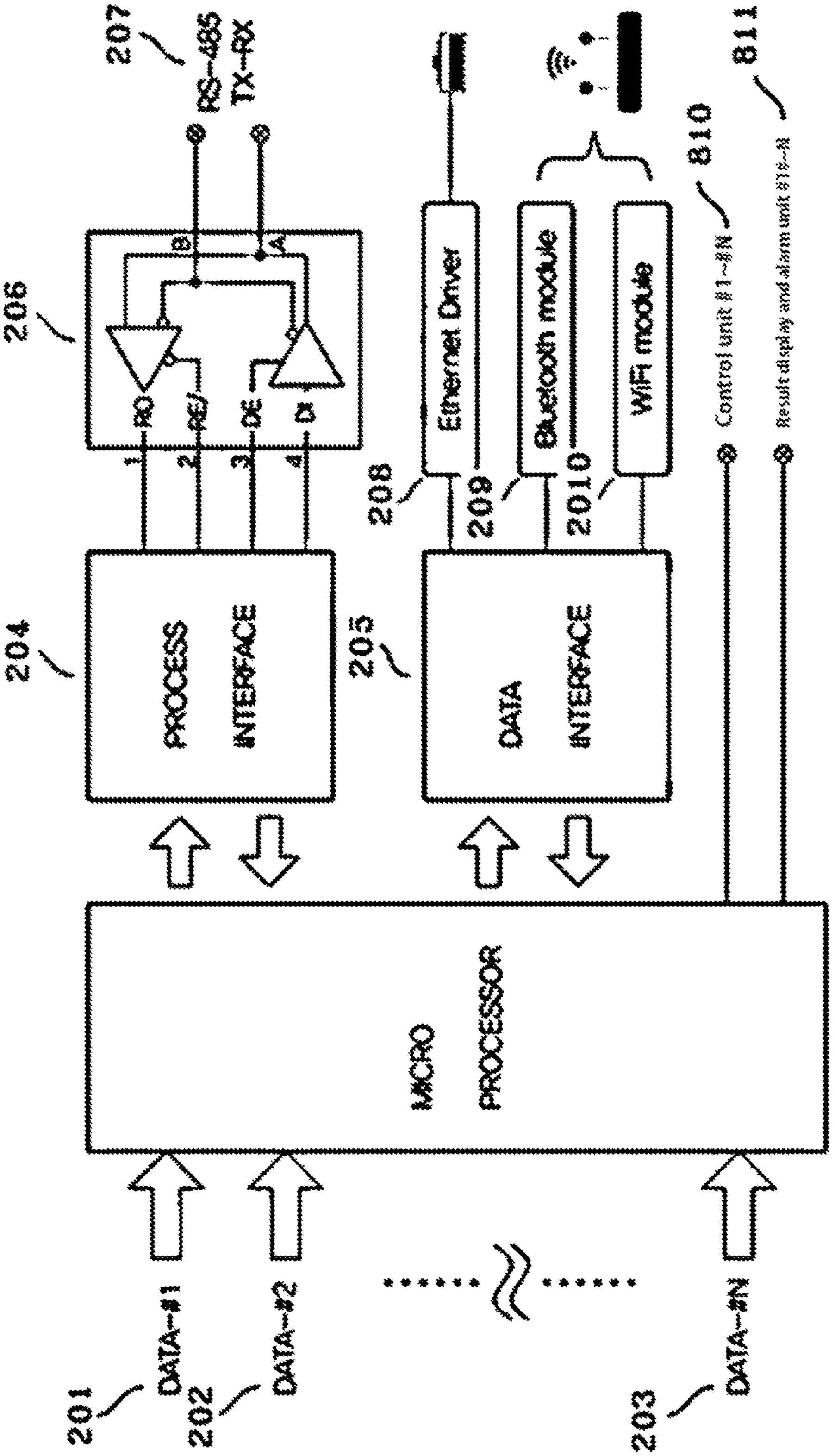
FIG. 20 is a configuration diagram of a transmittance control unit that enables determination of the operating state and wired/wireless remote control at a third place according to the present invention.

The transmittance control unit 812 as the same or similar configuration as or to FIG. 20, sends the data such as the standby, short, disconnection, normal, or operating state and the result display to the required flow pipe device through the same corresponding protocol as RS-485Tx-Rx(207) or receives the remote control input to send information on the operation control or result and the state of the device of analyzing and processing the abnormal load through the wired/wireless internet network.

The transmittance control unit 812 is constituted to send the corresponding information and input the remote control to a PC or a mobile phone by an applying means. That is, the transmittance control unit 812 is constituted to provide the state in the analyzing and processing process as operation information to an operating PC, a remote monitoring unit, or the like of the premises broadcasting device with a universal protocol format RS-485Tx-Rx(207) and the like through the dedicated communication conversion element 206 through the process interface 204 while performing the abnormal load analyzing and processing function by receiving the abnormal analysis command signal 23 of the 4 logic analyzing and processing unit 89 or implement the bi-directional remote operation control, and constituted to enlarge the corresponding information operation and control area of the abnormal load analyzing and processing by implementing the connection with a short-range wired communication network through the Ethernet driver 208 via the data interface 205, forming a short-range wireless communication network through a Bluetooth module 209 and implementing the connection to the mobile phone or the tablet PC, or connecting the wideband wireless Internet network through the Wi-Fi module 2010.

In this case, the control executing state for each channel of the control unit 811 and the operation situation state for each channel of the result display alarming unit 812 are always input to the CPU microprocessor to be monitored at a place required for the analysis result and the state sending.

In addition, the Ethernet driver 208, the Bluetooth module 209, and the Wi-Fi 33 module 2010 are accommodated in the device of analyzing and processing the abnormal load and a dedicated connection device or an antenna connection device is installed on the front and rear surfaces of the device.

Furthermore, the power supply unit 813 supplying the multiple static voltage power is constituted to supply the power required for operating 8 configuring devices of the generating step (S10), the configuring device of the analyzing step (S20), and the three configuring devices of the processing step (S30), and the input power of the power supply unit 813 is configured to use commercial power and emergency DC power together.

Figure 21:
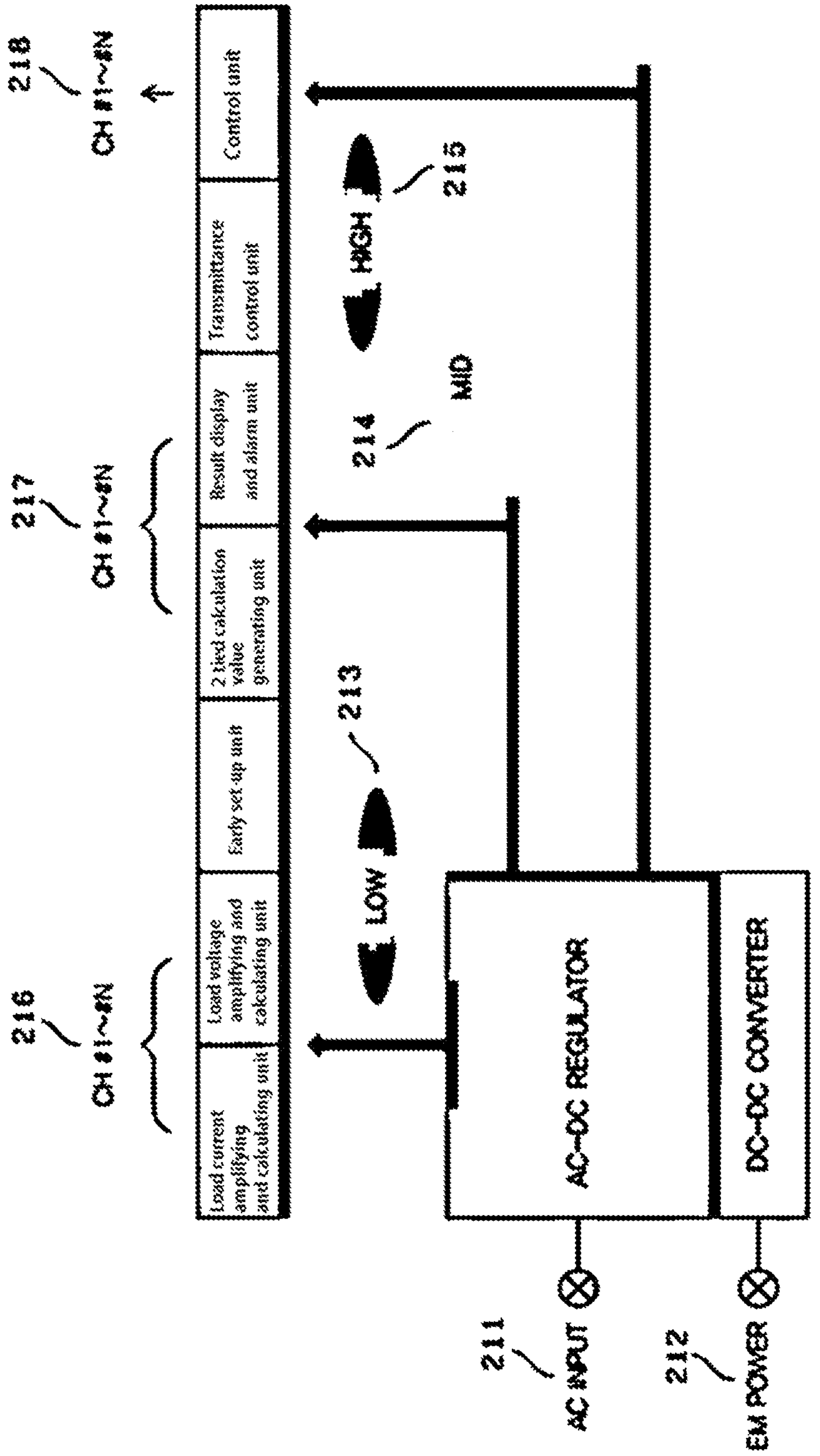
FIG. 21 is a configuration diagram of a power supply unit illustrating multiple constant voltage power supply system required for each component of the premises broadcasting device.

The power supply unit 813 as the same or similar configuration as or to FIG. 21, is constituted to supply a DC input terminal for blackout compensation or DC operation to a single power supply for emergency power and is set to 50 [V] or less by considering the versatility.

In this case, the power supply unit 813 is constituted to operate as AC commercial power at ordinary times or to supply a required power to each constitute element of the device through a DC-DC converter or a filter and a regulator for stabilization.

In addition, in FIG. 21, as three types or four types of stabilization power if necessary by receiving the AC commercial power 211 or the DC emergency power 212, a low voltage BUS 213 is supplied to a low voltage power requiring unit 216 corresponding to the load current amplifying and calculating unit 85+the load voltage amplifying and calculating unit 86, and a medium voltage BUS 214 which is relative medium voltage is supplied to a medium voltage power requiring unit 217 corresponding to the early set-up unit 87+the 4 logic analyzing and processing unit 89+the 2 tied calculation value generating unit 88+the result display alarming unit 811+the transmittance control unit 812, and the relative high voltage BUS 215 is supplied to a high voltage power requiring unit 218 corresponding to the control unit 810.

The power supply unit 813 is constituted by positive (+) and negative (−) power if necessary by the operation environment or the specification of the amplifying and converting element of each unit and minimizing each output voltage variation to supply the stabilization power enough to ensure the practical accuracy of the abnormal analysis.

Figure 22:
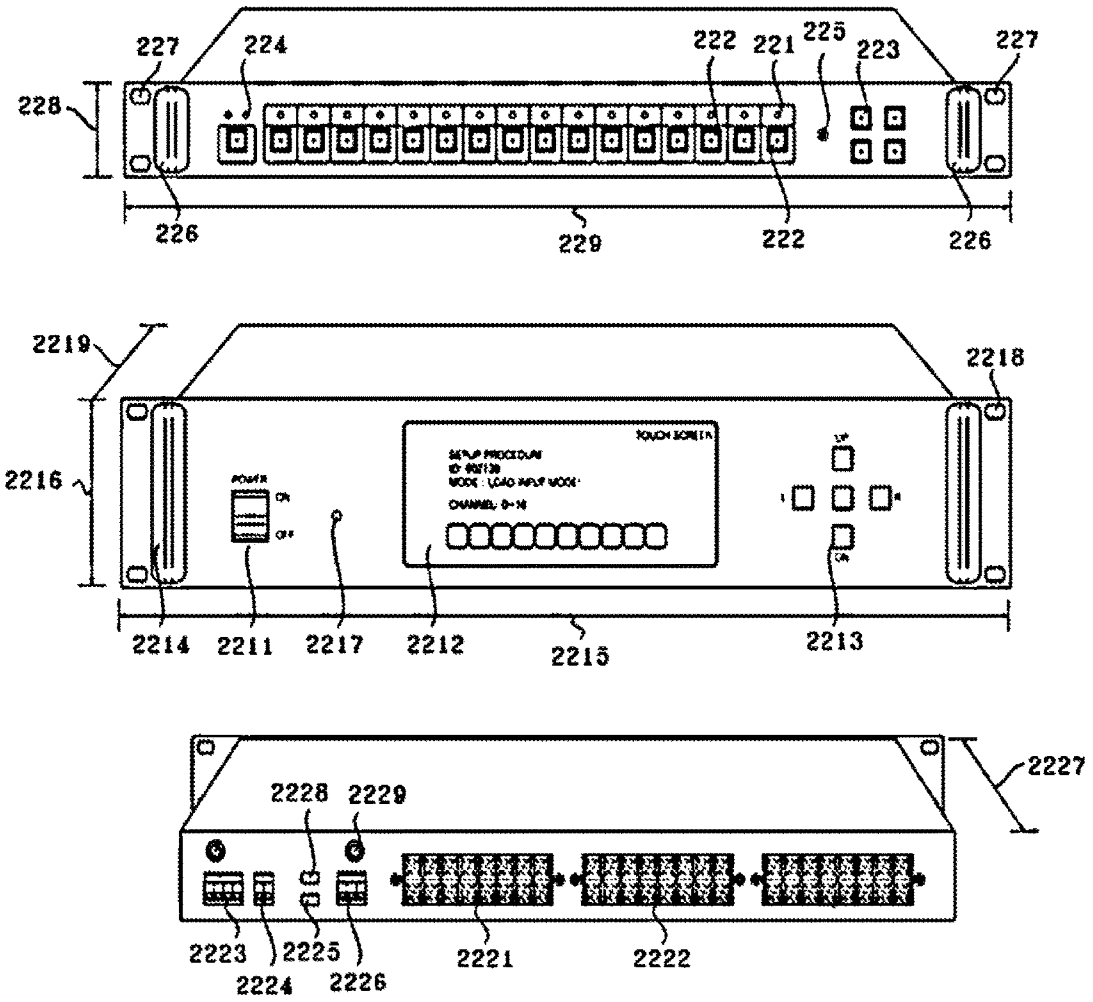
FIG. 22 is an exemplary diagram of a closure illustrating a structure of a storage type abnormal load analyzing and processing device according to the present invention.

Next, the device for analyzing and processing the abnormal load according to the present invention may be formed as a housing having a shape illustrated in FIG. 22.

In this case, the housing may have a form in which a marking unit capable of distinguishing the abnormal load analysis result by a multiple color division type or an LED displayer in the operation state of the display lamp 221 for each channel or the integrated operation display lamp 224; a button switch, a channel switch 222, and an alarm sound release button switch 223 which select or control the device for each channel or integrally, an alarm window 225 to transmit the alarm sound are disposed on the front side.

Further, on the front side of the housing, a display 2212 of a touch type or in menu type of multiple colors LCD or LED type in which texts, graphic icons, and the like are provided and information may be inputted may be further included. For example, the button switch, the channel switch, and the alarm sound release button switch except for the common regular-button switch 2213 are mounted on the corresponding display or associated and partially integrated with the in menu on the lower side or the side, the mounted button icon, marking icon, and the like are activated and deactivated when inputting and outputting the control command, an operation device required for operating the display information required on the flow pipe operation, the abnormality and the operation process for each channel may be analyzed by intuitive information with the naked eye through texts or icons, and a main power switch 11, the common regular button switch 2213, and the alarm window 2217 are disposed on the front side and add association lighting, blinking lighting, or planar lighting when the alarm operates to enhance information visibility together with the alarm sound.

In addition, on the rear side of the housing, an input connection unit 2221 connected with an output line of the output amplifier of the premises broadcasting device, an output connection unit 2222 connected with the house loudspeaker line, a power connection unit 2223 to which the commercial power and the emergency power are supplied, a contact point output terminal unit 24 for association with a separate external device, a data connection terminal unit 2226 of the transmittance control unit for remote control or remote monitoring, a USB port 2225, an Ethernet communication network connecting unit 2228, a Wi-Fi antenna terminal unit 2229, and the like may be disposed.

Furthermore, as an appearance and other details, the appearance of the device of the present invention has a structure which is detached from a compartment by considering use compatibility with the commercial premises broadcasting device, fixing holes 227 and 2218 are positioned at the left and right, handles 226 and 2214 of the device are provided at both sides of the main body for installation and maintenance, and it is preferred that horizontal standards 229 and 2215 are within 600 mm, vertical standards 228 and 2216 are 176 mm or less, and depth standards 2227 and 2219 are within 600 mm.

Figure 23:
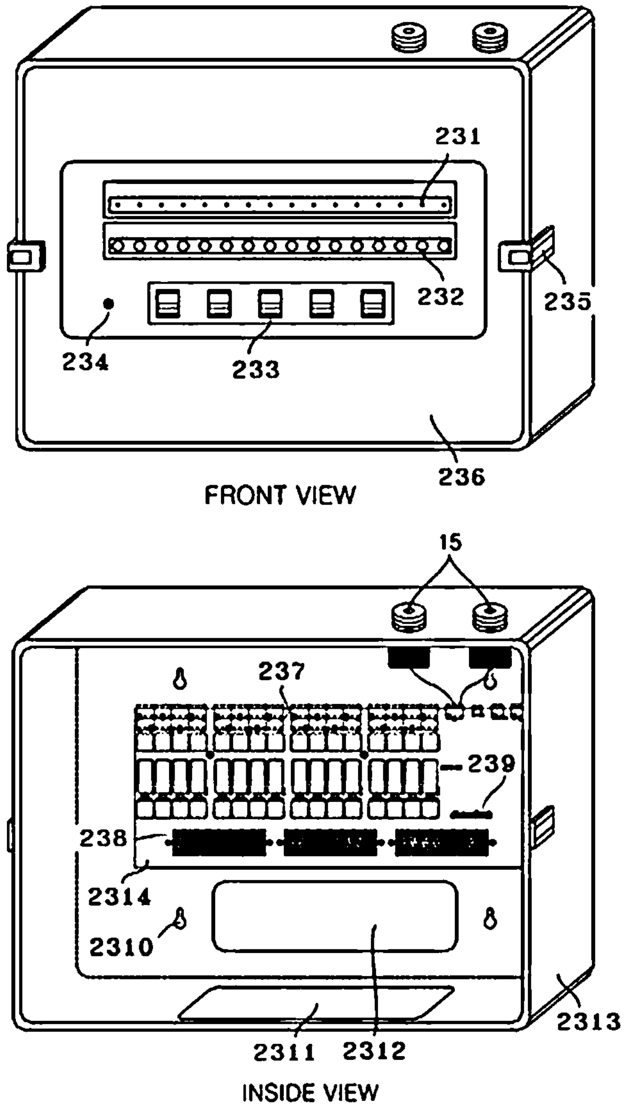
FIG. 23 is an exemplary diagram of another example of the closure illustrating a structure of an opened wall type abnormal load analyzing and processing device according to the present invention.

Further, the housing may be modified as the form illustrated in FIG. 23, and in this case, on the front side, a marking unit capable of distinguishing the abnormal load analysis by a multiple color division type or a text or graphic display in the operation state of the integrated operation display lamp or the display lamp 231 for each channel, each channel switch 232, an integral selection switch, other control button switches, a sound release button switch 233, and the like are disposed and an alarm window 234 may be disposed to transmit the alarm sound.

In addition, at the inside of the housing, a circuit board 2314 mounted with components is fastened to an external housing 2313, and a substrate-mounted connector 237 connected with a front panel, an input/output connection unit 238 connected with the amplifier of the premises broadcasting device and the house loudspeaker line to distinguish each terminal with the naked eye and perform line connection, a power connection unit to which the commercial power and the emergency power are supplied, a contact point output terminal unit for association with a separate external device, a data connection terminal unit of the transmittance control unit for remote controlling and remote monitoring, a flow pipe terminal unit 239 capable of connecting the USB port Ethernet communication network connection unit and the like, and a Wi-Fi antenna terminal unit 2315 may be disposed.

Further, installation and maintenance are used by providing a panel closing device 235 for closing and opening the front panel 236 or a closing and opening means having a similar function thereto, and like an inside view, a conduit through port having the corresponding wire size or more are provided on the wall surface 2312 and the upper and lower surfaces 2311 to pass through the corresponding wire integrated with the external housing 2313 constituting the device of the present invention, and a screw fixing port 2310 is provided to fasten the main body to the wall.

Figure 24:
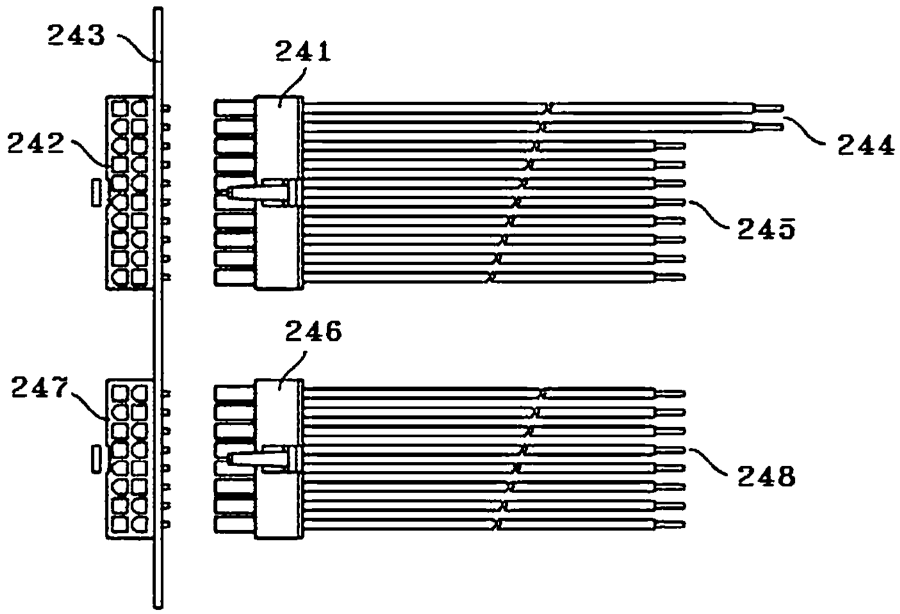
FIG. 24 is a structural diagram of a connector for connecting the amplifier and a load and a power supply of a house of the premises broadcasting device with the device according to the present invention.

In addition, in a connector for line connection, as illustrated in FIG. 24, a structure of a device-side connection unit 243 is positioned on the rear side or the side of the device of the present invention to be an input connection unit 247 connected with an output line of the output amplifier of the premises broadcasting device and a power output connection unit 242 connected with the commercial power or the emergency power and the house loudspeaker line and combines a fastening structure or color division for preventing mis-insertion between the input connection unit 247 and the power output connection unit 242.

Furthermore, cable-side connection units 241 and 246 may be connected to and separated from the power output connection unit 242 and the input connection unit 277 of the device-side connection unit 243 without separate tools and combines a fastening structure or color division for preventing mis-insertion.

Further, the line unit is divided into a power line unit 244 and an output line unit 245 connected to the power output connection unit 242 according to colors and lines of hot side and cold side so as to distinguish a characteristic and an order of a functional line.

Furthermore, an input line unit 248 connected with the input connection unit 247 divides a characteristic of the functional line to consider the color and the displacement so as to distinguish the order of the hot side and the cold side.

Further, the wire lengths of the power output line unit 245 and the input line unit 248 are provided within 3 m to be smoothly connected with the premises broadcasting device.

Meanwhile, in the above description, the 4 logic output 22 result values are divided into four types of standby, short, disconnection, and normality, but in some cases, only the short and disconnection states corresponding to the abnormal state are determined or only the standby and normal states corresponding to the normal state are determined to take necessary measures.

REFERENCE SIGNS LIST

FIG. 1 Background art reference system diagram—1

Figure 2:
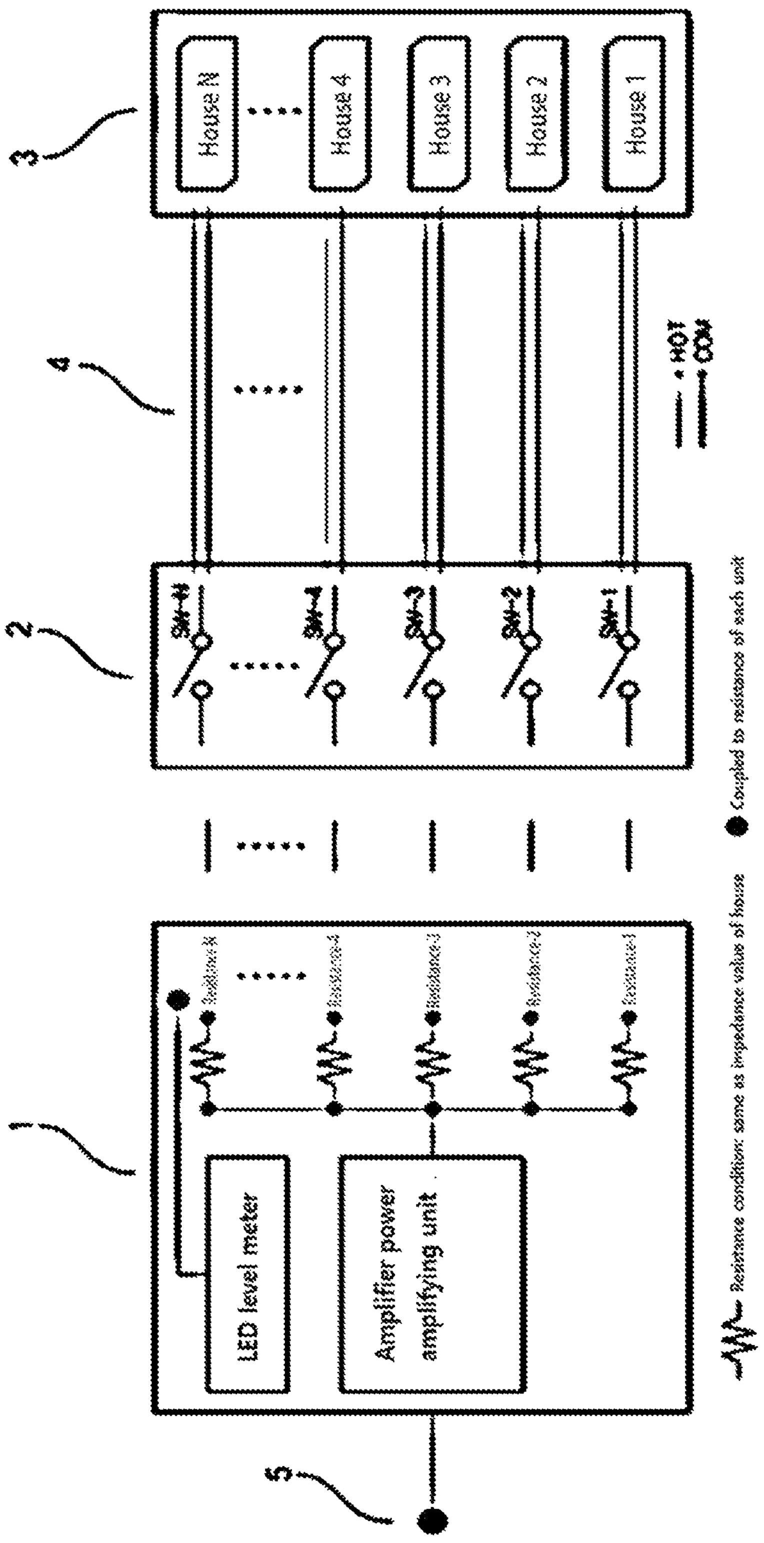
FIG. 2 is a background art reference system diagram presenting that all-time power is wasted as large as a load amount of a real load in the related art.

1: Amplifier and speaker protection circuit, 2: Speaker selection switch, 3: House loudspeaker group, 4: Loudspeaker distribution line, 5: Signal input terminal FIG. 2 Background art reference system diagram—2

1: Amplifier and speaker protection circuit, 2: Speaker selection switch, 3: House loudspeaker group, 4: Loudspeaker distribution line, 5: Signal input terminal FIG. 3 Outline view of method for analyzing and processing abnormal load S10: Generation step, S20: Analysis step, S30: Processing step, 11: Load pattern 2 elements, 12: Early 2 tied calculation value, 13: Real-time 2 tied calculation value, 21: 2 condition inputs, 22: 4 logic outputs, 23: Abnormal analysis command signal, 31: Control processing, 32: Result display and alarm processing, 33: Transmission control processing FIG. 4 Parallel connection pattern of house loudspeaker and amplifier

41: Signal input terminal, 42: Output amplifier of premises broadcasting device, 43: End house loudspeaker, 44: Intermediate point house loudspeaker, 45: Short point FIG. 5 Diagram of 2 tied calculation value

51: Graph level axis, 52: Graph time axis, 53: First period, 54: Second period, 55: Third period, 56: N-th period, 57: Load voltage value at each period, 58: Load current value at each period FIG. 6 Generation step process

61: Memory initialization, 62: Error offset average value calculation, 63: No-input processing, 64: No-load processing FIG. 7 Analyzing and processing step process

75: No-input and no-load processing, 76: Normal state limitless loop, 77: Short procedure, 78: Open procedure FIG. 8 Configuration diagram of device for analyzing and processing an abnormal load

81: Input connection unit, 82: Output connection unit, 83: Load current converting unit, 84: Load voltage converting unit, 85: Load current amplifying and calculating unit, 86: Load voltage amplifying and calculating unit, 87: Early set-up unit, 88: 2 tied calculation value generating unit 89: 4 logic analyzing and processing unit, 810: Control unit, 811: Result display and alarm unit, 812: Transmittance control unit, 813: Power supply unit FIG. 9 Configuration diagram of input connection unit

91, 92, 93: Individual channel input terminals, 94: Common (C), 95: Normal (HOT), 96: Emergency (EM)

FIG. 10 Configuration diagram of output connection unit

101, 102, 103: Individual channel output terminals, 104: Emergency (EM), 105: Normal (HOT), 106: Common (C)

FIG. 11 Configuration diagram of load current converting unit

111, 112, 113: All channels, 114, 115, 116: Individual current outputs, 117, 118, 119: Current transformer FIG. 12 Configuration diagram of load voltage converting unit

121, 122, 123: All channels, 124, 125, 126: Individual voltage outputs, 127, 128, 129: Potential transformers FIG. 13 Configuration diagram of load current amplifying and calculating unit

131: Current unit matcher, 132: Current unit filter, 133: Current unit reducer, 134: Current unit reducer, 135: Current unit protector, 136: Amplifying element 137: Output, 138: Input FIG. 14 Configuration diagram of load voltage amplifying and calculating unit

141: Voltage unit matcher, 142: Voltage unit filter, 143: Voltage unit reducer, 144: Voltage unit reducer, 145: Voltage unit protector, 146: Amplifying element, 147: Output, 148: Input FIG. 15 Configuration diagram of early set-up unit

151: Load current value and load voltage value 152: Manual USB input 153: Input selector 154: No-input processing 155: No-load processing 156: Control function 157: Load voltage value temporary storage 158: Load current value temporary storage 159: Accumulated time temporary storage 150: Stored value output FIG. 16 Configuration diagram of 2 tied calculation value generating unit

161: Early storage value input 162: Real-time calculation value input 163: Non-volatile memory storage array 164: Real-time tied value array 165: EEP ROM storage interface 166: Real-time calculation value interface 167: Drive interface 168: Early 2 tied calculation value output 169: Real-time 2 tied calculation value output FIG. 17 Configuration diagram of 4 logic analyzing and processing unit

171: 2 condition input #1 172: #1 real-time 2 tied calculation value 173: #1 early 2 tied calculation value 174: 2:4 logic analyzing and processing device #1 175: #1 processing step 3 components 176: 2 condition input #2 177: #2 real-time 2 tied calculation value 178: #2 early 2 tied calculation value 179: 2:4 logic analyzing and processing device #2 1710: #2 processing step 3 components 1711: 2 condition input #N 1712: #N real-time 2 tied calculation value 1713: #N early 2 tied calculation value: 1714: 2:4 logic analyzing and processing device #N 1715: #N processing step 3 components FIG. 18 Configuration diagram of control unit

181: #1 input connection unit, 182: #1 relay, 183: #1 output connection unit, 184: #1 drive interface, 185: #1 result display and alarm unit, 186: #2 input connection unit, 187: #2 relay, 188: #2 output connection unit, 189: #2 drive interface, 1810: #2 result display and alarm unit, 1811: #N input connection unit, 1812: #N relay, 1813: #N output connection unit, 1814: #N drive interface, 1815: #N result display and alarm unit FIG. 19 Configuration diagram of result display and alarm unit

191: Short and disconnection display lamp, 192: Normal and stand-by display lamp, 193: Check display lamp, 194: Individual channel switch, 195: Alarm sound release button, 196: Alarm window FIG. 20 Configuration diagram of transmittance control unit

201: Sample hold data #1, 202: Sample hold data #2, 203: Sample hold data #3, 204: Process interface, 205: Data interface, 206: Communication dedicated conversion element, 207: RS-485Tx-Rx, 208: Ethernet driver, 209: Bluetooth module, 2010: WiFi module, 810: Control units #1~#n, 811: Result display and alarm units #1~#n FIG. 21 Configuration diagram of power supply unit

211: AC uninterruptible power supply, 212: DC emergency power supply, 213: Low-voltage BUS, 214: Medium-voltage BUS, 215: High-voltage BUS, 216: Low-voltage power consuming unit, 217: Medium-voltage power consuming unit, 218: High-voltage power consuming unit FIG. 22 Structure diagram of exterior 1

221: Display lamp for each channel, 222: Channel switch, 223: Alarm sound release button switch, 224: Batch operating display lamp, 225, 2217: Alarm window, 226, 2214: Handle, 227, 2218: Screw fixing hole, 228, 2216: Vertical standard, 229, 2215: Horizontal standard, 2211: Main power switch, 2212: Display, 2213: Common all-the-time button switch, 2221: Input connection unit, 2222: Output connection unit, 2223: Power connection unit, 2224: Contact output terminal unit, 2225: USB port, 2226: Data connection terminal unit, 2219, 2227: Depth standard 2228: Ethernet communication network connection unit 2229: WiFi antenna terminal unit FIG. 23 Structure diagram of exterior 2

231: Display lamp for each channel, 232: Channel switch, 233: Alarm sound release button switch, 234: Alarm window, 235: Panel locking device, 236: Front panel, 237: Mounting type connector, 238: Input/output connection unit, 239: Related terminal unit, 2310: Screw fixing hole, 2311: Bottom surface, 2312: Wall surface, 2313: Enclosure 2314: Circuit board 2315: WiFi antenna terminal unit FIG. 24 Structure diagram of connector

241: Cable surface connection unit, 242: Power output connection unit, 243: Device surface connection unit, 244: Power line unit 245: Power output line unit 246: Cable surface connection unit, 247: Input connection unit, 248: Input line unit

The invention claimed is:

1. A method for analyzing and processing an abnormal load in an audio output signal system of a premises broadcasting device, wherein the audio output signal system comprises a plurality of channels connected in parallel to an output terminal of an amplifier of the premises broadcasting device and each of the plurality of channels includes a plurality of loudspeaker loads, the method comprising:

- calculating an early load voltage value and an early load current value for each of the plurality of channels while continuously maintaining a connection state between the amplifier and each of the plurality of channels and setting an early 2 tied calculation value for each of the plurality of channels by dividing the calculated early load voltage value by the calculated early load current value, wherein the early 2 tied calculation value is set up to a predetermined decimal place;
- continuously detecting a real-time load voltage value and a real-time load current value when an audio output signal is actuated for each of the plurality of channels while continuously maintaining the connection state between the amplifier and each of the plurality of channels and setting a real-time 2 tied calculation value obtained by dividing the detected real-time load voltage value by the detected real-time load current value, wherein the real-time 2 tied calculation value is set up to the predetermined decimal place;
- continuously comparing the early 2 tied calculation value and the real-time 2 tied calculation value corresponding to each of the plurality of the channels for which the audio output signal is supplied;
- determining at least one of plurality of the channels as a short abnormal state or a disconnection abnormal state if the early 2 tied calculation value and the real-time 2 tied calculation value are different from each other with respect to the corresponding channel;
- determining the corresponding channel as the short abnormal load state or an upward fluctuation abnormal load state if A is less than B, and determining the corresponding channel as the disconnection abnormal load state or a downward fluctuation abnormal state if A is greater than B, wherein A is the early 2 tied calculation value and B is the real-time 2 tied calculation value; and
- electrically separating an output side of the amplifier of the premises broadcasting device and the corresponding channel if the corresponding channel is determined as the short abnormal state.

2. The method of claim 1 wherein the short abnormal state, the upward fluctuation abnormal load state, the disconnection abnormal state, or the downward fluctuation abnormal load state is displayed, warned to the outside, or simultaneously displayed and warned to the outside.

3. A device for analyzing and processing an abnormal load on a premises broadcasting device comprising a plurality of channels connected to an output terminal of an amplifier of the premises broadcasting device wherein each of the plurality of channels include a plurality of loudspeaker loads to which audio output signals are provided from the amplifier of the premises broadcasting device through each of the respective channels, the device comprising:

- an input connection unit connecting in parallel with the output terminal of the amplifier of the premises broadcasting device;
- an output connection unit connecting between the input connection unit and the plurality of loudspeaker loads;
- a control unit connecting the output connection unit with the input connection unit or interrupting the output connection unit from the input connection unit; and
- an abnormal load analyzing and processing unit controlling the connection and interruption of the control unit, wherein the abnormal load analyzing and processing unit comprises:

a load current converting unit serially connected to the input connection unit, wherein the control unit controlled by the abnormal load analyzing and processing unit is connected to the input connection unit, and the load current converting unit calculates a load current value by using an audio signal provided to the corresponding channel;

a load voltage converting unit connected in parallel to the input connection unit, wherein the control unit controlled by the abnormal load analyzing and processing unit is connected to the input connection unit, and the load voltage converting unit calculates a load voltage value by using the audio signal provided to the corresponding channel;

a load current amplifying and calculating unit which includes a current unit matching unit receiving the load current value of the load current converting unit and a first OP-AMP amplifying unit amplifying the received load current value at a predetermined ratio for abnormal load analyzing and processing;

a load voltage amplifying and calculating unit which includes a voltage unit matching unit receiving the load voltage value of the load voltage converting unit and a second OP-AMP amplifying unit amplifying the received load voltage value at a predetermined ratio for the abnormal load analyzing and processing;

an early set-up unit storing and outputting an early 2 tied calculation value obtained by dividing an early load voltage value by an early load current value for the channel connected to the control unit, wherein the early 2 tied calculation value is stored and outputted up to a predetermined decimal place;

a 2 tied calculation value generating unit for setting a real-time 2 tied calculation value obtained by dividing a real-time load voltage value of the channel measured in real time using the audio signal provided from the amplifier of the premises broadcasting device by a real-time load current value, wherein the real-time 2 tied calculation value is set up to the predetermined decimal place, and outputting the real-time 2 tied calculation value together with the early 2 tied calculation value provided from the early set-up unit as 2 condition input elements; and a 4 logic analyzing and processing unit receiving the early 2 tied calculation value and the real-time 2 tied calculation value as the 2 condition input elements, analyzing the values to determine that the current state is the stand-by state of the channel if the early 2 tied calculation value exists and the real-time 2 tied calculation value does not exist, the current state is the short or upward fluctuation load state of the channel if the early 2 tied calculation value is less than the real-time 2 tied calculation value, the current state is the disconnection or downward fluctuation load state of the channel if the early 2 tied calculation value is greater than the real-time 2 tied calculation value, and the current state is the normal state of the channel if the early 2 tied calculation value is equal to the real-time 2 tied calculation value, and providing, according to the determination, a control processing command as an abnormal analysis command signal for connection to and interruption from the control unit controlled by the abnormal load analyzing and processing unit.

* * * * *